United States Patent
Kaneto et al.

(10) Patent No.: US 7,096,083 B2
(45) Date of Patent: Aug. 22, 2006

(54) DESIGN SUPPORT APPARATUS AND METHOD FOR SUPPORTING DESIGN OF RESIN MOLD PRODUCT

(75) Inventors: Osami Kaneto, Chigasaki (JP); Toshiya Teramae, Hiratsuka (JP); Junichi Saeki, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/628,273

(22) Filed: Jul. 29, 2003

(65) Prior Publication Data

US 2004/0093104 A1    May 13, 2004

(30) Foreign Application Priority Data

Jul. 29, 2002    (JP)    ............................. 2002-219922

(51) Int. Cl.
*G06F 19/00*    (2006.01)

(52) U.S. Cl. .................... 700/97; 700/197; 700/198
(58) Field of Classification Search ................ 700/97, 700/197–205; 703/1, 9
See application file for complete search history.

(56) References Cited

U.S. PATENT DOCUMENTS

| | | | |
|---|---|---|---|
| 5,031,127 A * | 7/1991 | Fujita et al. ................ 700/197 |
| 5,035,598 A * | 7/1991 | Fujita et al. ................ 425/144 |
| 5,097,432 A * | 3/1992 | Harada et al. ................ 703/9 |
| 6,136,235 A * | 10/2000 | Saito et al. ................ 264/40.1 |
| 6,161,057 A * | 12/2000 | Nakano ...................... 700/197 |
| 6,192,327 B1 * | 2/2001 | Nishiyama et al. ............ 703/2 |
| 6,856,856 B1 * | 2/2005 | Kolavennu et al. ......... 700/197 |
| 2001/0051858 A1* | 12/2001 | Liang et al. ................... 703/2 |
| 2004/0230411 A1* | 11/2004 | Zheng et al. .................. 703/6 |
| 2005/0179158 A1* | 8/2005 | Harada et al. ................ 264/51 |
| 2005/0181085 A1* | 8/2005 | Harada et al. .............. 425/4 R |

FOREIGN PATENT DOCUMENTS

| JP | 6-187321 A | 7/1994 |
|---|---|---|
| JP | 7-334484 A | 12/1995 |

\* cited by examiner

*Primary Examiner*—Leo Picard
*Assistant Examiner*—Alexander Kosowski
(74) *Attorney, Agent, or Firm*—Antonelli, Terry, Stout and Kraus, LLP.

(57) ABSTRACT

A design support apparatus including: a flow analyzer for analyzing a flow of thermosetting resin injected into a resin filling cavity to mold a resin mold product made of the thermosetting resin, using a finite difference method or a finite element method; a residual strain calculator for calculating residual strain (or stress) of the thermosetting resin after heat shrinkage of the thermosetting resin injected into the resin filling cavity to mold the resin mold product; and a strength analyzer for analyzing strength of the resin mold product, using a finite element method. According to this arrangement, strength of the resin mold product made of the thermosetting resin can be predicted accurately.

7 Claims, 21 Drawing Sheets

Tg (GLASS-TRANSITION POINT)

TEMPERATURE T

STEP S3 (CALCULATION OF RESIDUAL STRAIN (STRESS))

DESIGN SUPPORT APPARATUS AND METHOD FOR SUPPORTING DESIGN OF RESIN MOLD PRODUCT

BACKGROUND OF THE INVENTION

As a system for supporting designing of a resin mold product (such as a diode package) made of thermosetting resin, there are known a flow analysis system and a strength analysis system. The flow analysis system utilizes a finite difference method or a finite element method, to analyze a flow of resin. The strength analysis system utilizes a finite element method to analyze strength of a resin mold product. Conventionally, there exist various methods of flow analysis and strength analysis. Such a method is disclosed in Japanese Laid-open Publication Nos. H07-334484 and H06-187321.

SUMMARY OF THE INVENTION

The thermosetting resin shrinks in its volume at the time of thermal cure (cure shrinkage). Further, even after the thermal cure, the thermosetting resin shrinks in its volume when resin temperature changes from the curing temperature to the room temperature (heat shrinkage). Thus, a finished product of the thermosetting resin molding has residual strain (stress) according to the cure shrinkage and the heat shrinkage.

The conventional strength analysis systems make the strength analysis without considering such the residual strain (stress). Thus, it is impossible to predict strength with accuracy. Sometimes, there occurs large difference between a strength analysis result of the strength analysis system and a result of strength test on a trial product. In that case, designing must be carried out once again, repeating the flow analysis and the strength analysis.

The present invention has been made considering the above-described situation.

Namely, an object of the present invention is to predict accurately strength of a resin mold product made of thermosetting resin.

To solve the above problem, one of design support apparatuses included in the present application comprises: a flow analysis means which analyzes a flow of thermosetting resin injected into a resin filling cavity to mold a resin mold product made of the thermosetting resin, using the finite difference method or the finite element method; a residual strain calculation means which calculates residual strain (or stress) of the thermosetting resin after heat shrinkage of the thermosetting resin injected into the resin filling cavity to mold said resin mold product; and a strength analysis means which analyzes strength of said resin mold product, using the finite element method.

Here, the flow analysis means calculates a coefficient of elasticity and a strain (or stress) component of the thermosetting resin at heat curing, for each of first three-dimensional solid elements used for the flow analysis.

For example, the flow analysis means calculates changes of a temperature and a reaction rate expressed as functions of time, and a change of a viscosity expressed as a function of the reaction rate, for each time step and for each of the first three-dimensional solid elements. And, for each of first three-dimensional solid elements whose reaction rates reach a reaction rate of gelling, the flow analysis means calculates the strain (stress) component at the time of the heat curing, based on a relation between the reaction rate and a specific volume, and calculates the coefficient of elasticity at the time of the heat curing, based on relations of the reaction rate and the temperature to the coefficient of elasticity.

Further, the residual strain calculation means uses correspondence between each of second three-dimensional solid elements used for the strength analysis by said strength analysis means and each of said first three-dimensional solid elements, and the temperature, the coefficient of elasticity and the strain (or stress) component calculated for each of said first three-dimensional solid elements by said flow analysis means, in order to set a coefficient of elasticity and a strain (or stress) component at the time of the heat curing for each of the second three-dimensional solid elements. And, the residual strain calculation means calculates residual strain (or stress) after the heat shrinkage for each of said second three-dimensional solid elements.

For example, the residual strain calculation means sets a representative point to each of said first three-dimensional solid element and each of said second three-dimensional solid element. Then, for each of the second three-dimensional solid elements, the residual strain calculation means calculates averages of temperatures, coefficients of elasticity and strain (or stress) components of at least one of the first three-dimensional solid elements whose representative points are close to the representative point of the second three-dimensional solid element in question, weighting the temperatures, the coefficients of elasticity and the strain (or stress) components according to distances of their representative points from the representative point of the second three-dimensional solid element in question. And, the residual strain calculation means sets the calculated averages as a temperature, a coefficient of elasticity and a strain (or stress) component to the second three-dimensional solid element in question.

Further, for example, for each of the second three-dimensional solid elements, the residual strain calculation means calculates residual strain, using the temperature, the coefficient of elasticity and the strain (or stress) component set to the second three-dimensional solid element in question, and using a variation of coefficient of elasticity in a case where the temperature is cooled down to a predetermined temperature.

And, the strength analysis means sets the residual strain (or stress), which is calculated by the residual strain calculation means, to each of the second three-dimensional solid elements, and analyzes the strength of the resin mold product.

According to the present invention, residual strain due to the cure shrinkage and the heat shrinkage is set to each second three-dimensional solid element, and the strength of the resin mold product is analyzed by the finite element method using those three-dimensional solid elements. As a result, it is possible to predict strength of the resin mold product more accurately than the conventional technique.

DESCRIPTION OF THE PREFERRED EMBODIMENTS

First, before describing a design support apparatus to which an embodiment of the present invention is applied, a resin mold product as an object of design support by the design support apparatus will be described.

Figure 1:
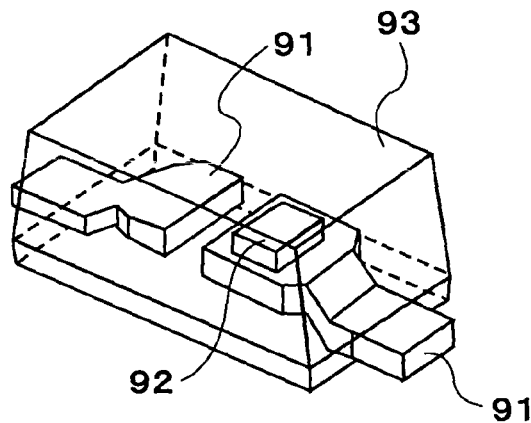
FIG. 1 is a view showing an example of a resin mold product made of thermosetting resin, as an object of design support by a design support apparatus to which an embodiment of the present invention is applied.

FIG. 1 shows an example of a resin mold product made of thermosetting resin, as an object of design support by the design support apparatus to which an embodiment of the present invention is applied.

This example is an ordinary diode package constructed such that frames 91 and a pellet 92 of an Si chip are sealed with resin 93 i.e., thermosetting resin. The diode package having such structure is formed by setting the frames 91 and the pellet 92 within a mold, and thereafter, flowing the resin 93 into the mold to fill it, effectuating the heat curing reaction to solidify the resin 93 filled, and taking out the product from the mold.

Figure 2:
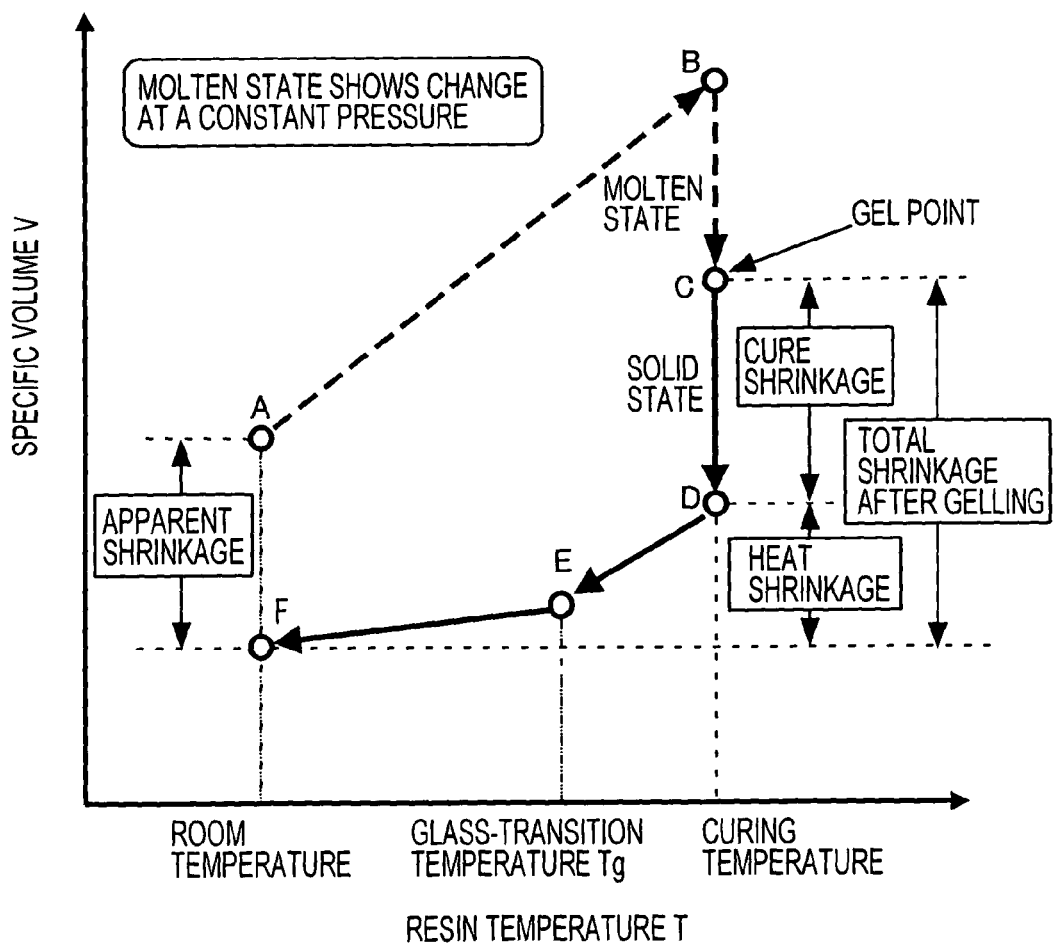
FIG. 2 is a diagram showing relation between a specific volume and temperature in a molding process of thermosetting resin.

FIG. 2 is a diagram showing relation between a specific volume and temperature in the molding process of the thermosetting resin. Here, the vertical axis indicates a specific volume V and the horizontal axis indicates a resin temperature T.

As shown in the figure, as the resin temperature T rises from the room temperature (the point A), the specific volume V of the thermosetting resin becomes larger due to thermal expansion and melting of the thermosetting resin occurs at a temperature (the melting temperature, not shown) higher than the softening temperature. Then, when the resin temperature T reaches the curing temperature (the point B), curing begins due to thermal reaction. When the rate of thermal reaction reaches a certain area, the thermosetting resin changes from the molten state to a gel state (the point C). When the thermal reaction proceeds further, the thermosetting resin is solidified completely (the point D). In the course of change from the molten state to the solid state, shrinking occurs due to the thermal reaction curing (cure shrinkage). The amount of shrinkage due to the cure shrinkage is the variation of the specific volume V from the point C to the point D.

Further, in the course of the fall in the thermosetting resin's temperature from the curing temperature (the point D) through the glass-transition temperature Tg (the point E) to the room temperature (the point F), shrinking due to the temperature fall occurs (heat shrinkage). The amount of shrinkage due to the heat shrinkage is the variation of the specific volume V from the point D to the point F.

Thus, there exists a change in the specific volume V of the thermosetting resin in the room temperature state before and after the heat curing (namely, the change from the specific volume V at the point A to the specific volume V at the point F). This change in the specific volume V causes residual strain and accompanying residual stress. Depending on the position and degree of the residual stress, the strength of the molded product may be largely weakened.

The design support apparatus according to the present embodiment estimates and sets such residual strain in each three-dimensional solid element used for three-dimensional strength analysis, so that it is possible to predict accurately the strength of a resin mold product made by thermosetting resin.

Next, a design support apparatus to which an embodiment of the present invention is applied will be described.

Figure 3:
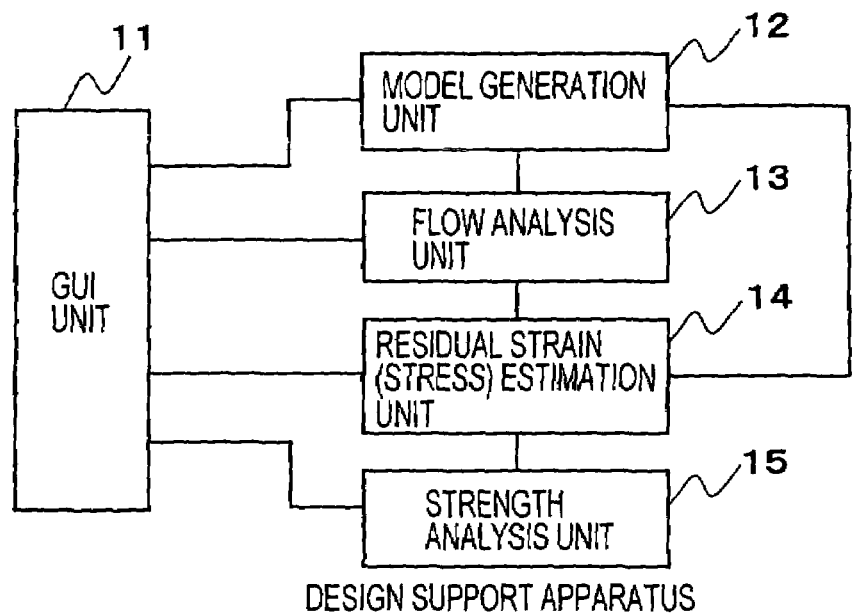
FIG. 3 is a block diagram showing a design support apparatus to which an embodiment of the present invention is applied.

FIG. 3 is a block diagram showing a design support apparatus to which an embodiment of the present invention is applied.

As shown in the figure, the design support apparatus of the present embodiment comprises a GUI (Graphical User Interface) unit 11, a model generation unit 12, a flow analysis unit 13, a residual strain (stress) estimation unit 14, and a strength analysis unit 15.

The GUI unit 11 receives input such as various instructions and information from a user through a display screen and an input unit such as a keyboard, a mouse, or the like, and displays, for example, a result of three-dimensional flow analysis or three-dimensional strength analysis of thermosetting resin.

The model generation unit 12 generates geometry data (model data) of a resin mold product molded of thermosetting resin as an object of the design support, according to a user's instruction received through the GUI unit 11. As the model generation unit 12, 3D-CAD, CAM, CAE or the like may be used.

The flow analysis unit 13 analyzes a flow within a mold cavity in a molding process of thermosetting resin, using the finite difference method or the finite element method (three-dimensional flow analysis). At that time, for each three-dimensional solid element (hereinafter, referred to as first three-dimensional solid element) used for the three-dimensional flow analysis, the flow analysis unit 13 calculates temperature, a coefficient of elasticity and a strain (stress) component of the thermosetting resin after the cure shrinkage (i.e., at the point D in FIG. 2).

The residual strain (stress) estimation unit 14 sets temperature, a coefficient of elasticity and strain (stress) component for each three-dimensional solid element (hereinafter, referred to as second three-dimensional solid element) used for three-dimensional strength analysis in the strength analysis unit 15 by using correspondence between each second three dimensional solid element and each first three-dimensional solid element, and the temperature, the coefficient of elasticity and the strain (stress) component calculated by the flow analysis unit B for each first three-dimensional solid element. Further, for each second three-dimensional solid element for which the temperature, the coefficient of elasticity and the strain (stress) component were set, the residual strain (stress) estimation unit 14 calculates the residual strain (stress) of the thermosetting resin after the heat shrinkage (i.e., at the point F in FIG. 2).

For each second three-dimensional solid element, the strength analysis unit 15 sets the residual strain (or stress) calculated by the residual strain (stress) estimation unit 14, and analyzes the strength of the resin mold product, using the finite element method.

Figure 4:
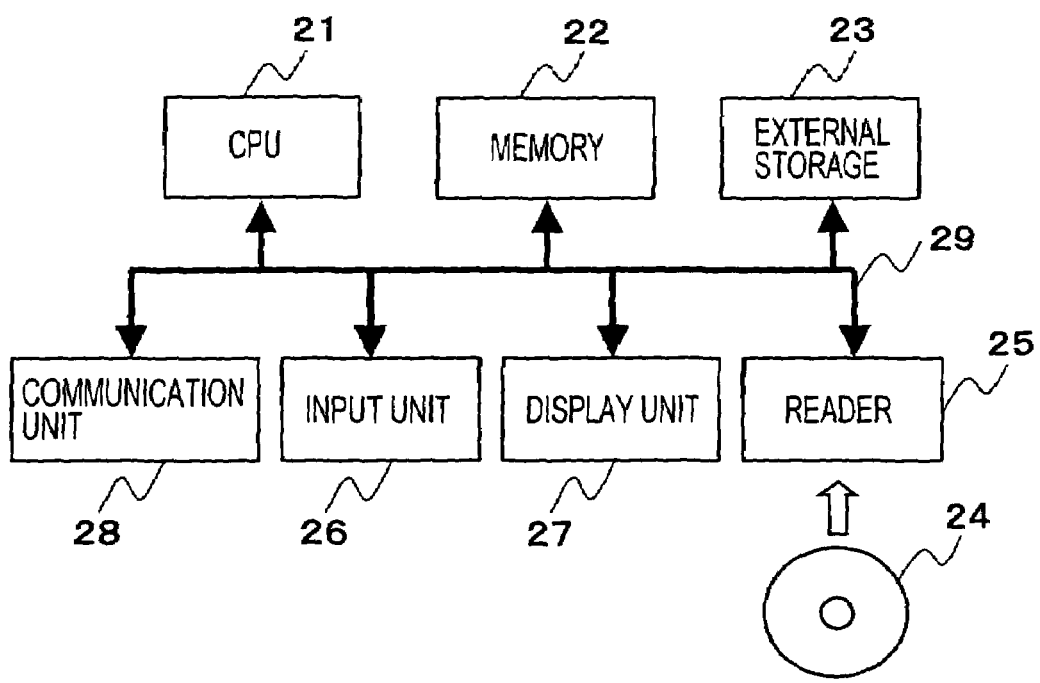
FIG. 4 is a block diagram showing an example of a hardware configuration of the design support apparatus shown in FIG. 3.

The design support apparatus having the above-described structure can be implemented, for example, on an ordinary computer system via a bus 29 as shown in FIG. 4, comprising a CPU 21, a memory 22, an external storage 23 such as an HDD, a reader 25 for reading information from a portable storage medium 24 such as a CD-ROM, a DVD-ROM, or the like, an input unit 26 such as a keyboard or a mouse, a display unit 27 such as a CRT or LCD, and a communication unit 28 for communicating with a network such as Internet, when the CPU 21 executes certain programs (a 3D-CAD, CAM or CAE program for implementing the model generation unit 12, a three-dimensional flow analysis program for implementing the flow analysis unit 13, a residual strain (stress) estimation program for implementing the residual strain (stress) estimation unit 14, and a three-dimensional strength analysis program for implementing the strength analysis unit 15) loaded onto the memory 22. These programs may be directly loaded onto the memory 22 from a storage medium 24 through the reader 25, or from a communication medium such as Internet through the communication unit 28. Or, these programs may be once downloaded onto the external storage 23 before loaded onto the memory 22.

Next, operation of the design support apparatus having the above-described structure will be described.

Figure 5:
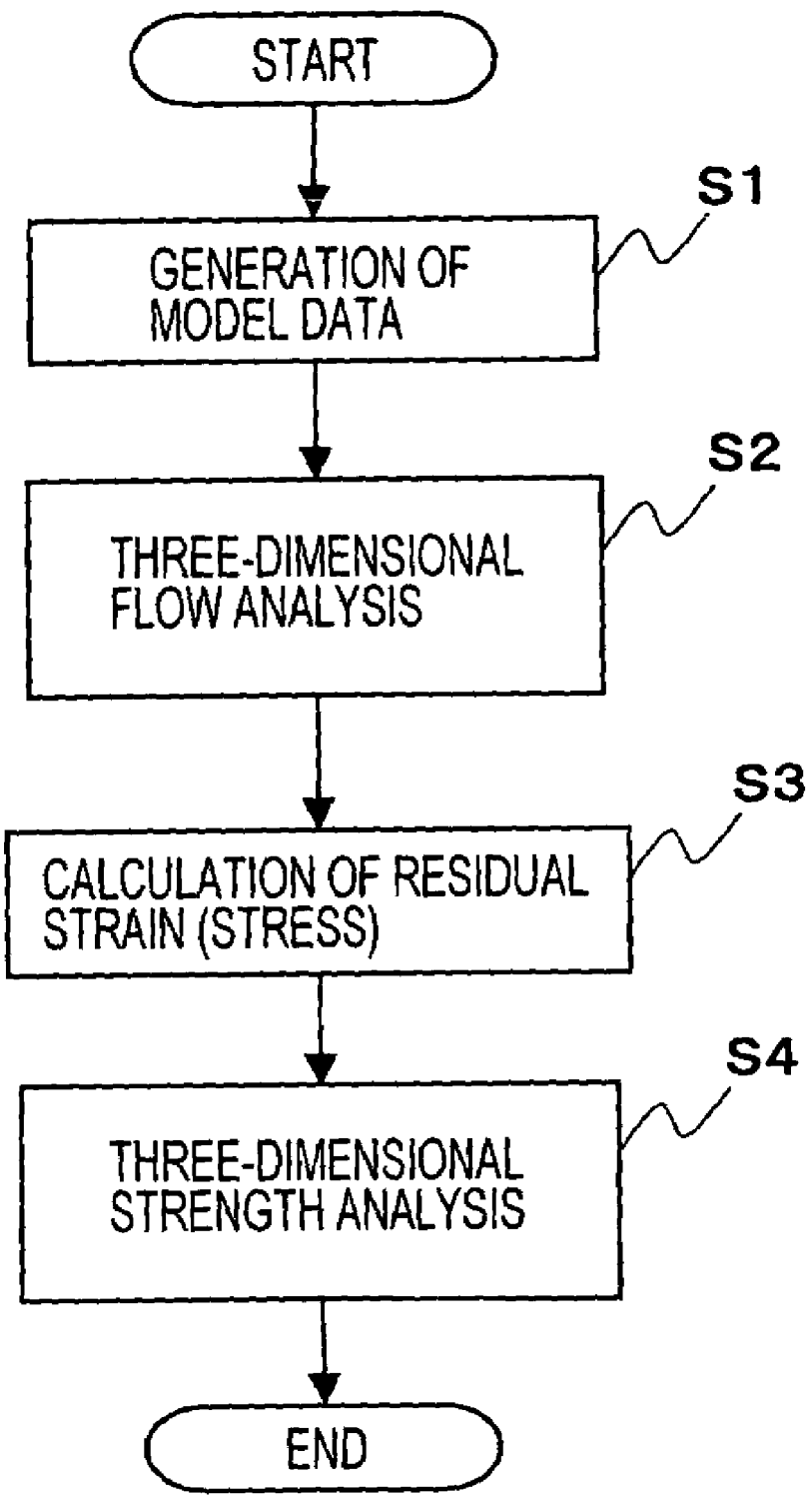
FIG. 5 is a flowchart for explaining an outline of operation of a design support apparatus to which an embodiment of the present invention is applied.

FIG. 5 is a flowchart for explaining an outline of operation of the design support apparatus to which the embodiment of the present invention is applied.

As shown, design support according to the design support apparatus of the present embodiment comprises five steps S1–S4, generally speaking.

Step S1: Model Data Generation Processing

The model generation unit 12 generates model data of the resin mold product as the object of the design support, according to a user's instruction received through the GUI unit 11. It is assumed that the model data include at least shapes and position data of: the internal cavity of the mold used for molding; an injection hole (nozzle) for injecting the thermosetting resin into the internal cavity; and members placed within the internal cavity at the time of molding, except the thermosetting resin (i.e., members sealed by the resin, hereinafter, referred to as sealed members).

Step S2: Three-Dimensional Flow Analysis Processing

The flow analysis unit 13 divides the internal cavity of the mold, which is specified by the model data generated in the step S1, into a plurality of first three-dimensional solid elements, according to a user's instruction received through the GUI unit 11. Then, the flow analysis unit 13 receives physical property values, a boundary condition and an analytical condition (a molding condition or the like) from a user through the GUI unit 11. Then, based on these data, the flow analysis unit 13 analyzes a flow of the thermosetting resin in the case where the thermosetting resin is injected from the injection hole specified by the above-mentioned model data into the above-mentioned internal cavity (namely, a leading end position of the resin flow in each time step for each first three-dimensional solid element). The flow analysis unit 13 presents the analysis result to the user through the GUI unit 11.

At that time, a reaction rate (expressed by a function of time and temperature) and a time step change of viscosity (expressed by a function of the reaction rate and temperature) are substituted into the equation of continuity, the equation of motion and the energy conservation equation (these equations will be mentioned below), in order to calculate at least temperature, a viscosity and a reaction rate of the thermosetting resin in each time step for each first three-dimensional solid element. Then, for each first three-dimensional solid element whose reaction rate reaches gelling, the strain (stress) component at the heat curing is calculated based on the relation between the reaction rate and the specific volume, and the coefficient of elasticity at the heat curing is calculated based on the relation between the reaction rate, the temperature and the coefficient of elasticity.

Step S3: Residual Strain (Stress) Calculation Processing

According to a user's instruction received through the GUI unit 11, the residual strain (stress) estimation unit 14 divides the resin mold product (the internal cavity of the mold) specified by the model data generated in Step S1, into a plurality of second three-dimensional solid elements, and associates at least one first three-dimensional solid element generated in Step S2 with each of the second three-dimensional solid elements.

Next, for each second three-dimensional solid element, the residual strain (stress) estimation unit 14 sets temperature, coefficient of elasticity and strain (stress) component of the second three-dimensional solid element in question, based on the temperature, coefficient of elasticity and strain (stress) component of each first three-dimensional solid element associated with that second three-dimensional solid element.

Then, the residual strain (stress) estimation unit 14 calculates residual strain (stress) for each second three-dimensional solid element, using the set temperature, strain (stress) component and coefficient of elasticity, and using a variation of the coefficient of elasticity in the case where the set temperature is cooled down to the room temperature. Here, the variation of the coefficient of elasticity is determined by the temperature dependency of the coefficient of elasticity of the thermosetting resin.

Step S4: Three-Dimensional Strength Analysis Processing

According to a user's instruction received through the GUI unit 11, the strength analysis unit 15 sets the residual strain (or stress) calculated in the step S3 for each of the second three-dimensional solid elements generated in the step S3. Then, the strength analysis unit 15 receives physical property values of the thermosetting resin and the sealed members, a boundary condition and an analytical condition (condition such as heat, load or the like expected to occur at the time of use as a product) from the user through the GUI unit 11. And, based on these data, the strength analysis unit 15 analyzes the strength of the resin mold product by the finite element method.

Next, each of the above-described steps S2–S4 will be described in detail.

By the way, the model data generation processing carried out in the step S1 is similar to the model data generation processing carried out as a preliminary processing of the conventional three-dimensional flow analysis or three-dimensional strength analysis, and therefore, its detailed description is omitted.

First, the three-dimensional flow analysis processing carried out in the step S2 will be described.

Figure 6:
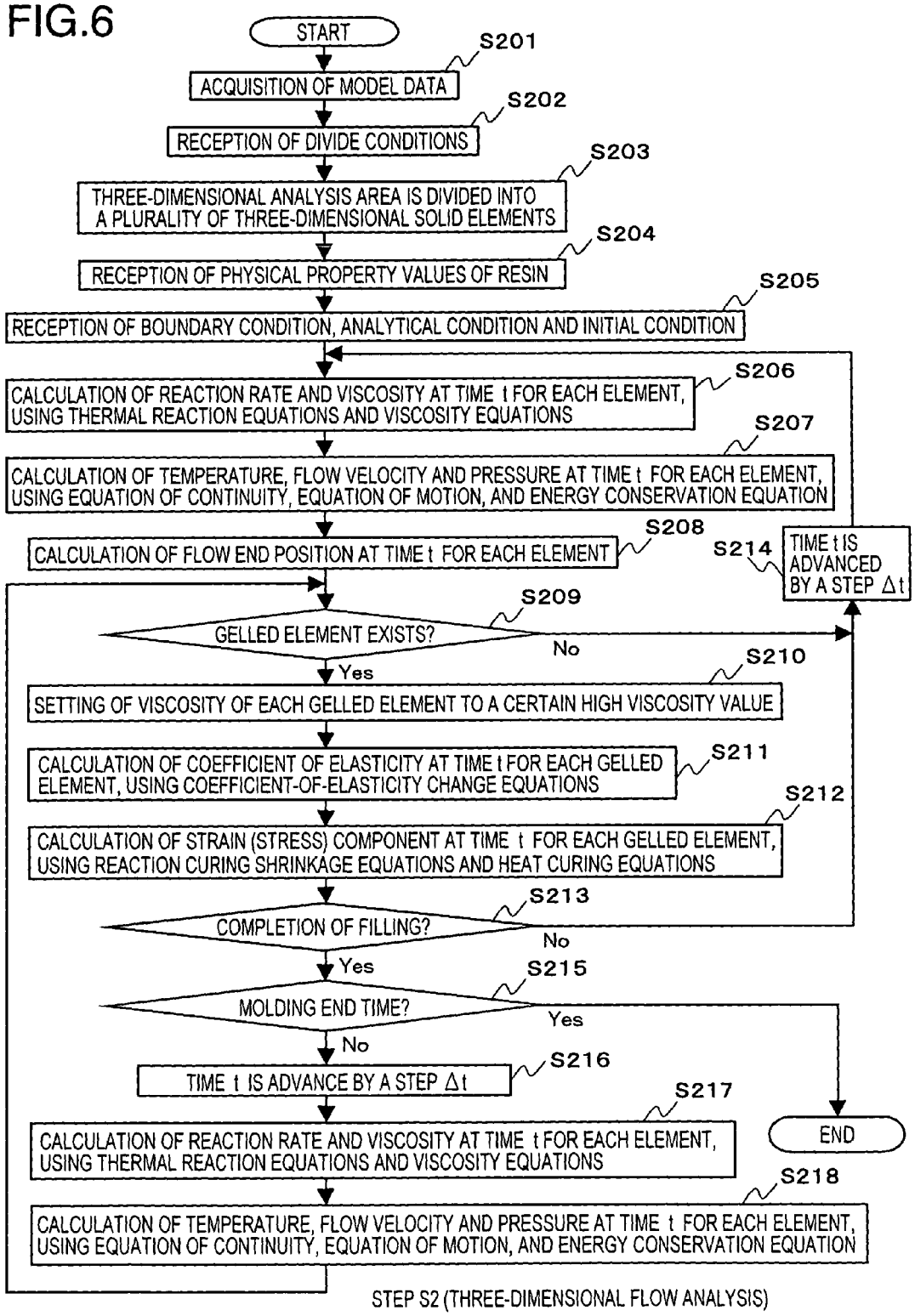
FIG. 6 is a flowchart for explaining three-dimensional flow analysis processing of an embodiment of the present invention.

FIG. 6 is a flowchart for explaining the three-dimensional flow analysis processing.

When the flow analysis unit 13 receives an instruction of three-dimensional flow analysis from the user through the GUI unit 11, then, the flow analysis unit 13 receives designation of model data from the user through the GUI unit 11. Then, the designated model data are acquired from the model generation unit 12 (S201).

Next, the flow analysis unit 13 sets the mold internal cavity (resin filling area) (which is specified by the acquired model data) as a three-dimensional analysis area in the finite difference method or the finite element method. Then, conditions (the number of division, element size, and the like) for dividing this three-dimensional analysis area into a plurality of first three-dimensional solid elements are received from the user through the GUI unit 11 (S202). The flow analysis unit 13 divides the three-dimensional analysis area into the plurality of first three-dimensional solid elements, according to the received divide conditions (S203).

Next, the flow analysis unit 13 receives the thermosetting resin's physical property values required for the three-dimensional flow analysis and for calculation of residual strain (stress), from the user through the GUI unit 11 (S204). In the present embodiment, as the physical property values of the thermosetting resin, the flow analysis unit 13 receives at least a heat curing shrinkage coefficient, glass-transition temperature, linear expansion coefficient, reaction rate at the end of heat curing, reaction rate at gelling, coefficient of elasticity, initial viscosity of the thermosetting resin, and various coefficients used in the three-dimensional flow analysis and in the below-mentioned equations (thermal reaction equations, viscosity equations, the equation of continuity, the equation of motion, the energy conservation equation, coefficient-of-elasticity change equations, and reaction curing shrinkage equations) for calculating the strain (stress) component and coefficient of elasticity at the heat curing.

Next, the flow analysis unit 13 receives various conditions (a boundary condition, an analytical condition and an initial condition) for the three-dimensional flow analysis from the user through the GUI unit 11 (S205). The various conditions include an initial temperature and inflow velocity of the thermosetting resin, temperature of the mold, nozzle data (position and size), and the like.

When the flow analysis unit 13 acquires various data required for the three-dimensional flow analysis and for calculating the strain (stress) component and the coefficient of elasticity at the heat curing, as described above, then, the flow analysis unit 13 starts analysis of a change in the resin flow at each time step Δt (three-dimensional flow analysis) and calculation of a strain (stress) component due to the heat curing shrinkage and coefficient of elasticity for each three dimensional solid element.

First, the flow analysis unit 13 set time t at an initial time. Then, the flow analysis unit 13 calculates a reaction rate and viscosity at the time t for each first three-dimensional solid element, using the thermal reaction equations and the viscosity equations (S206).

Here, the thermal reaction equations are expressed by Eqs. 1–5.

$$\partial A(t)/\partial t = (K_1(T)+K_2(T)A(t)^M)(1-A(t))^N \qquad \text{Eq. 1}$$

$$K_1(T)=Ka\ \exp(-Ea/T) \qquad \text{Eq. 2}$$

$$K_2(T)=Kb\ \exp(-Eb/T) \qquad \text{Eq. 3}$$

$$A(t)=Q(t)/Q_0 \qquad \text{Eq. 4}$$

$$\partial Q(t)/\partial t = Q_0(K_1(T)+K_2(T)A(t)^M)(1-A(t))^N \qquad \text{Eq. 5}$$

Here, A refers to a reaction rate; t to time; T to temperature; $\partial A(t)/\partial t$ to a reaction rate; $K_1(T)$ and $K_2(T)$ to coefficients as functions of temperature; N, M, Ka, Kb, Ea and Eb to intrinsic coefficients of the material; Q(t) to a heat release value until time t; $Q_0$ to a gross heat release value until the end of the reaction; and $\partial Q(t)/\partial t$ to a heat release rate. Among them, the material intrinsic coefficients N, M, Ka, Kb, Ea and Eb are the thermosetting resin's physical property values received in the step S204. Further, the temperature T is the molding condition received in the step S205, and expressed as a function of time t (from the point A to the point C in FIG. 2).

Further, the viscosity equations are expressed by Eqs. 6–8.

$$\eta = \eta_0(T)((1+A/A_{gel})/(1-A/A_{gel}))^{C(T)} \qquad \text{Eq. 6}$$

$$\eta_0 = a\ \exp(b/T) \qquad \text{Eq. 7}$$

$$C = f/T - g \qquad \text{Eq. 8}$$

Here, η refers to a viscosity; $\eta_0$ to an initial viscosity; T to temperature; A to a reaction rate; $A_{gel}$ to a reaction rate at gelling; C to a temperature-rise coefficient; and a, b, f and g are intrinsic viscosity parameters of the material. Among them, the reaction rate at gelling $A_{gel}$ and the intrinsic viscosity parameters of the material a, b, f and g are the thermosetting resin's physical property values received in the step S204. Further, a part of the temperature T (initial temperature of the mold and resin) is the molding condition received in the step S205, and expressed as a function of time t (from the point A to the point C in FIG. 2). And, the reaction rate A is the reaction rate obtained from Eqs. 1–5 at time t.

Next, the flow analysis unit 13 calculates temperature, flow velocity and pressure at time t for each first three-dimensional solid element, using the equation of continuity, the equation of motion and the energy conservation equation (S207).

The equation of continuity is expressed as Eq. 9.

$$\frac{\partial \rho}{\partial t} + \frac{\partial(\rho u)}{\partial x} + \frac{\partial(\rho v)}{\partial y} + \frac{\partial(\rho \omega)}{\partial z} = 0 \qquad \text{Eq. 9}$$

Further, the equation of motion is expressed by Eq. 10 in the x-direction, Eq. 11 in the y-direction and Eq. 12 in the z-direction.

$$\rho \frac{\partial u}{\partial t} = \rho g_x - \frac{\partial P}{\partial x} + \frac{\partial}{\partial x}\left(2\eta \frac{\partial u}{\partial x}\right) + \frac{\partial}{\partial y}\left(\eta\left(\frac{\partial v}{\partial x} + \frac{\partial u}{\partial y}\right)\right) + \frac{\partial}{\partial z}\left(\eta\left(\frac{\partial u}{\partial z} + \frac{\partial \omega}{\partial x}\right)\right) - \rho\left(u\frac{\partial u}{\partial x} + v\frac{\partial u}{\partial y} + \omega\frac{\partial u}{\partial z}\right) \qquad \text{Eq. 10}$$

$$\rho \frac{\partial v}{\partial t} = \rho g_y - \frac{\partial P}{\partial y} + \frac{\partial}{\partial y}\left(2\eta \frac{\partial v}{\partial y}\right) + \frac{\partial}{\partial x}\left(\eta\left(\frac{\partial u}{\partial y} + \frac{\partial v}{\partial x}\right)\right) + \frac{\partial}{\partial z}\left(\eta\left(\frac{\partial \omega}{\partial y} + \frac{\partial v}{\partial z}\right)\right) - \rho\left(u\frac{\partial v}{\partial x} + v\frac{\partial v}{\partial y} + \omega\frac{\partial v}{\partial z}\right) \qquad \text{Eq. 11}$$

$$\rho \frac{\partial \omega}{\partial t} = \rho g_z - \frac{\partial P}{\partial z} + \frac{\partial}{\partial z}\left(2\eta \frac{\partial \omega}{\partial z}\right) + \frac{\partial}{\partial y}\left(\eta\left(\frac{\partial v}{\partial z} + \frac{\partial \omega}{\partial y}\right)\right) + \frac{\partial}{\partial x}\left(\eta\left(\frac{\partial u}{\partial z} + \frac{\partial \omega}{\partial x}\right)\right) - \rho\left(u\frac{\partial \omega}{\partial x} + v\frac{\partial \omega}{\partial y} + \omega\frac{\partial \omega}{\partial z}\right) \qquad \text{Eq. 12}$$

Further, the energy conservation equation is expressed as Eq. 13.

$$\rho C_p \left(\frac{\partial T}{\partial t} + u\frac{\partial T}{\partial x} + v\frac{\partial T}{\partial y} + \omega\frac{\partial T}{\partial z}\right) = \beta T\left(\frac{\partial P}{\partial t} + u\frac{\partial P}{\partial x} + v\frac{\partial P}{\partial y} + \omega\frac{\partial P}{\partial z}\right) + \eta \gamma^2 + \lambda\left(\frac{\partial^2 T}{\partial x^2} + \frac{\partial^2 T}{\partial y^2} + \frac{\partial^2 T}{\partial z^2}\right) + \rho\left(\frac{\partial Q}{\partial t}\right) \qquad \text{Eq. 13}$$

Here, $\rho$ refers to a density; u to a velocity in the x-direction; $\upsilon$ to a velocity in the y-direction; $\omega$ to a velocity in the z-direction; $\gamma$ to a shear rate; T to temperature; P to pressure; t to time; $\eta$ to viscosity; Cp to specific heat at constant pressure; $\beta$ to a coefficient of cubic expansion; $\lambda$ to a thermal conductivity; $g_x$ to an acceleration in the x-direction; $g_y$ to an acceleration in the y-direction; and $g_z$ to an acceleration in the z-direction. Among them, the coefficient of cubic expansion b and the thermal conductivity $\lambda$ are the thermosetting resin's physical property values received in the step S204. Further, the density $\rho$ is the thermosetting resin's physical property value received in the step S204 and a change of p is expressed as a function of time t (from the point A to the point C in FIG. 2). Further, the shear rate $\gamma$ is a value obtained from a velocity differential and distance between adjacent positions. And, the viscosity $\eta$ is the viscosity obtained from Eqs. 6–8 at time t.

Further, the flow analysis unit 13 obtains a leading end position of the resin at time t for each first three-dimensional solid element, using the flow velocity obtained in the step S207 for each first three-dimensional solid element (S208).

Thus-obtained various data for each first three-dimensional solid element are registered into the memory or the like, as flow analysis data of the thermosetting resin at time t.

Next, the flow analysis unit 13 examines whether there exists a first three-dimensional solid element in which the reaction rate A obtained in the step S206 reaches the reaction rate at gelling $A_{gel}$ received as the resin's physical property value in the step S204 (S209). When no such first three-dimensional solid element exists, time t is put forward by a time step $\Delta t$ (S214), and the processing is returned to the step S206. On the other hand, when there exists at least one first three-dimensional solid element in which gelling starts, then, the flow analysis unit 13 calculates a strain (stress) component and a coefficient of elasticity at time t for each of such elements.

Now, there will be described changes of the reaction rate A, the viscosity $\eta$, the coefficient of elasticity E and the specific volume V with respect to molding time of the thermosetting resin in a molten state.

Figure 7:
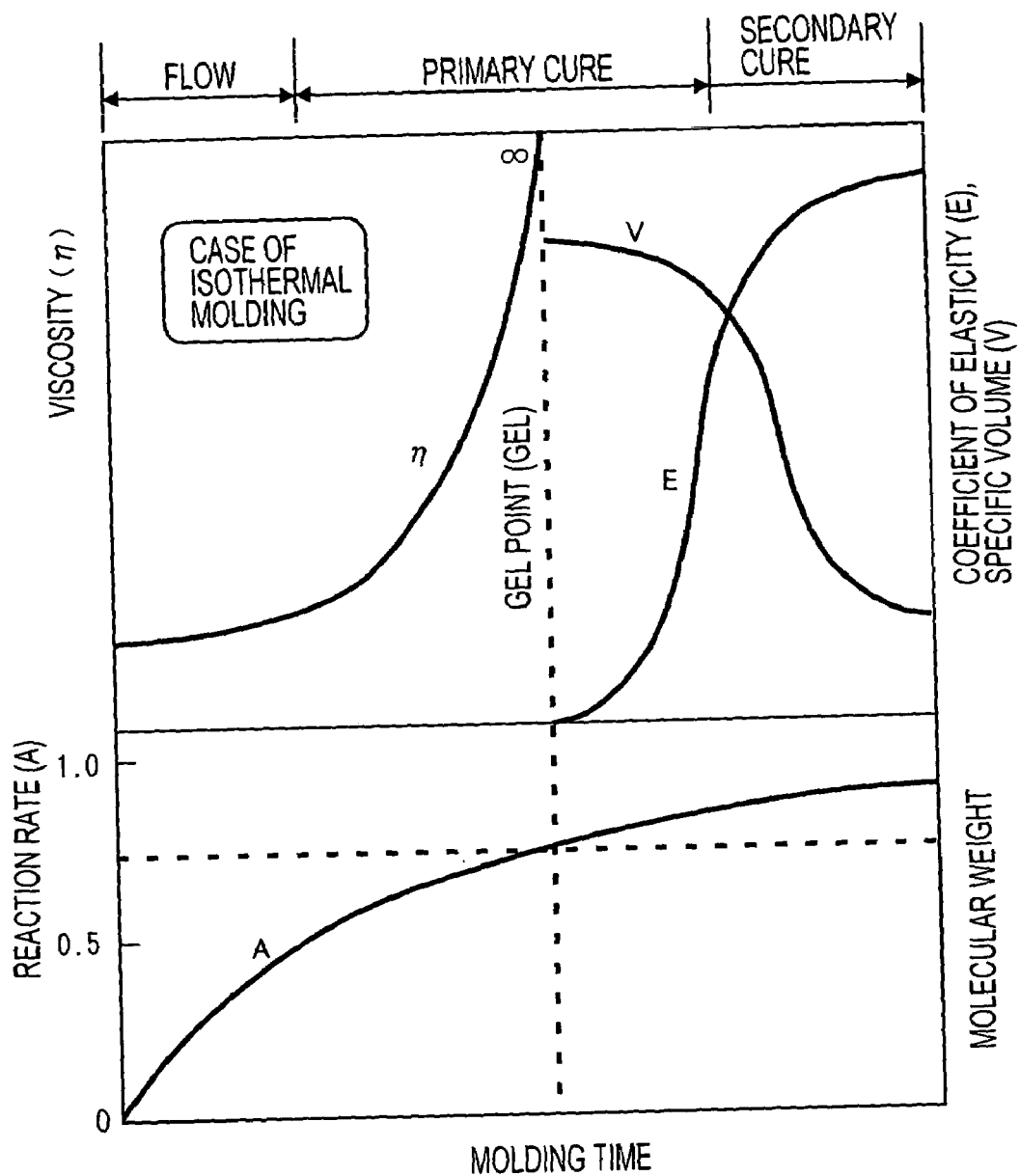
FIG. 7 is a diagram showing changes of a reaction rate A, a viscosity η, a coefficient of elasticity E and a specific volume V.

FIG. 7 is a diagram for explaining changes of a reaction rate A, a viscosity $\eta$, a coefficient of elasticity E, and a specific volume V with respect to molding time of the thermosetting resin in a molten state.

As shown in the figure, in a molten state, the reaction rate A increases with the lapse of molding time (with a higher ascending rate in an earlier stage and a slower rate in a latter stage), approaching 1 when complete reaction (a completely cured state) is expressed as 1. Further, the viscosity $\eta$ is smaller when the resin flows within the mold, and increases rapidly to the infinity after the mold is filled with the resin (primary cure). The point of time when the viscosity becomes the infinity is the gel point. When the reaction rate A reaches the gel point, the thermosetting resin starts to change into jelly, or starts to solidify.

Solidification of the thermosetting resin is finished in the course of the primary cure within the mold. In the meantime, the specific volume V decreases slowly, and the coefficient of elasticity E of the material increases rapidly. Thereafter, in a process of taking out the molded product from the mold and cooling the product (second cure), the specific volume V decreases rapidly, while the coefficient of elasticity E increases slowly.

Occurrence of residual strain (stress) accompanying cure of the thermosetting resin after flowing is caused by a shrinkage phenomenon of the specific volume V from the gel point. Accordingly, the flow analysis unit 13 calculates a strain (stress) component due to heat curing shrinkage and a coefficient of elasticity for each first three-dimensional solid element in which gelling is started.

First, for each first three-dimensional solid element in which gelling is started, the flow analysis unit 13 sets the viscosity $\eta$ to a certain viscosity value that is sufficiently high for showing that gelling is started (S210). When a first three-dimensional solid element in the course of flowing gels, then, the viscosity $\eta$ of that element becomes the infinity, and the calculation for that element is stopped. In fact, however, the resin continues to flow in the other first three-dimensional solid elements, when the element in question does not gel. Thus, when there comes out a first three-dimensional solid element that gels, then, as a means to express a practical situation, the viscosity η of that element is set to the certain viscosity value that is sufficiently high so that the resin is made to flow in that element, and the calculation for that element is prevented from stopping.

Next, for each first three-dimensional solid element in which gelling is started, the flow analysis unit 13 calculates the coefficient of elasticity E at time t, using coefficient-of-elasticity change equations (S211).

Figure 8:
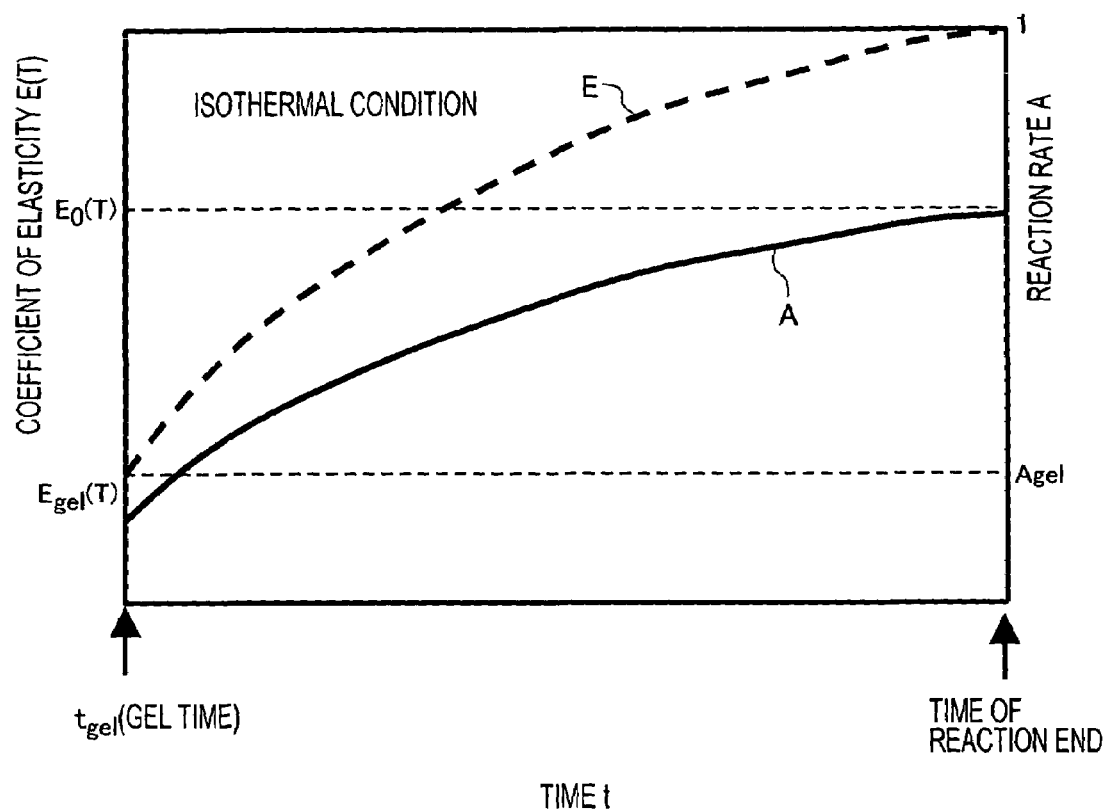
FIG. 8 is a diagram for explaining relations of a coefficient of elasticity and a reaction rate of thermosetting resin to time in an isothermal condition.

Now, the coefficient-of-elasticity change equations will be described. FIG. 8 is a diagram for explaining relations of a coefficient of elasticity and a reaction rate of the thermosetting resin to time in an isothermal condition.

As shown in the figure, as the heat curing reaction proceeds (as time t goes), molecules of the thermosetting resin form a three-dimensional network so that the resin becomes harder. Accordingly, even in the isothermal condition, the coefficient of elasticity E increases. Further, with the same reaction rate A, when temperature T is higher, it is easy for the molecules to move, and the coefficient of elasticity E decreases. On the other hand, at a lower temperature T, it is more difficult for the molecules to move, and the coefficient of elasticity E increases. Accordingly, the coefficient of elasticity E is expressed as a function of the reaction rate A and temperature T.

Figure 9:
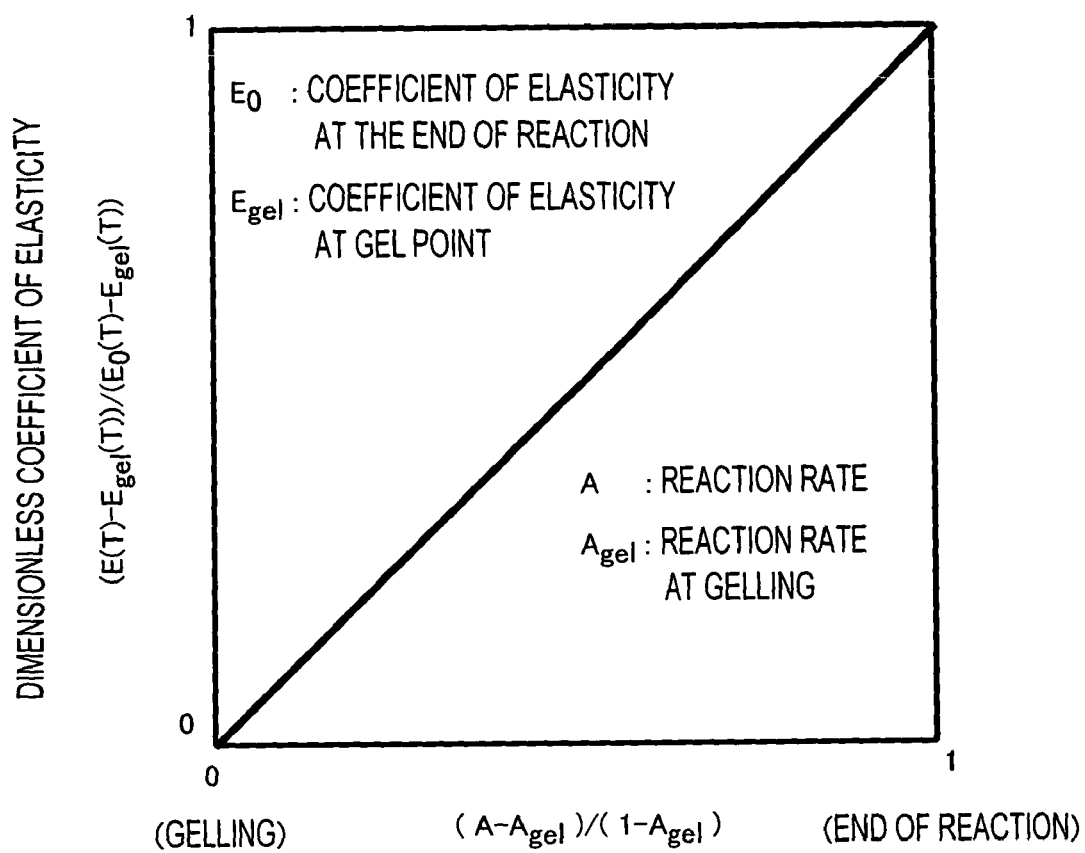
FIG. 9 is a diagram for explaining a relation between a dimensionless coefficient of elasticity and a reaction rate.

When simplified, the relation of the coefficient of elasticity E to the reaction rate A in an isothermal condition can be expressed by the relation of FIG. 9 between a dimensionless coefficient of elasticity and the reaction rate. Thus, at a temperature T, a relation of the coefficient of elasticity E(T) to a change of reaction rate A is expressed by Eq. 14.

$$E(T)=E_{gel}(T)+(E_0(T)-E_{gel}(T))(A-A_{gel})/(1-A_{gel}) \qquad \text{Eq. 14}$$

Here, $E_{gel}(T)$ refers to the coefficient of elasticity at gelling at the temperature T; $E_0(T)$ to the coefficient of elasticity at the end of the reaction at the temperature T; and $A_{gel}$ to the reaction rate at gelling. These are the thermosetting resin's physical property values received in the step S204. Further, the temperature T and the reaction rate A are the temperature and the reaction rate calculated for time t in the steps S206 and S207 or the below-described steps S217 and S218.

Figure 10:
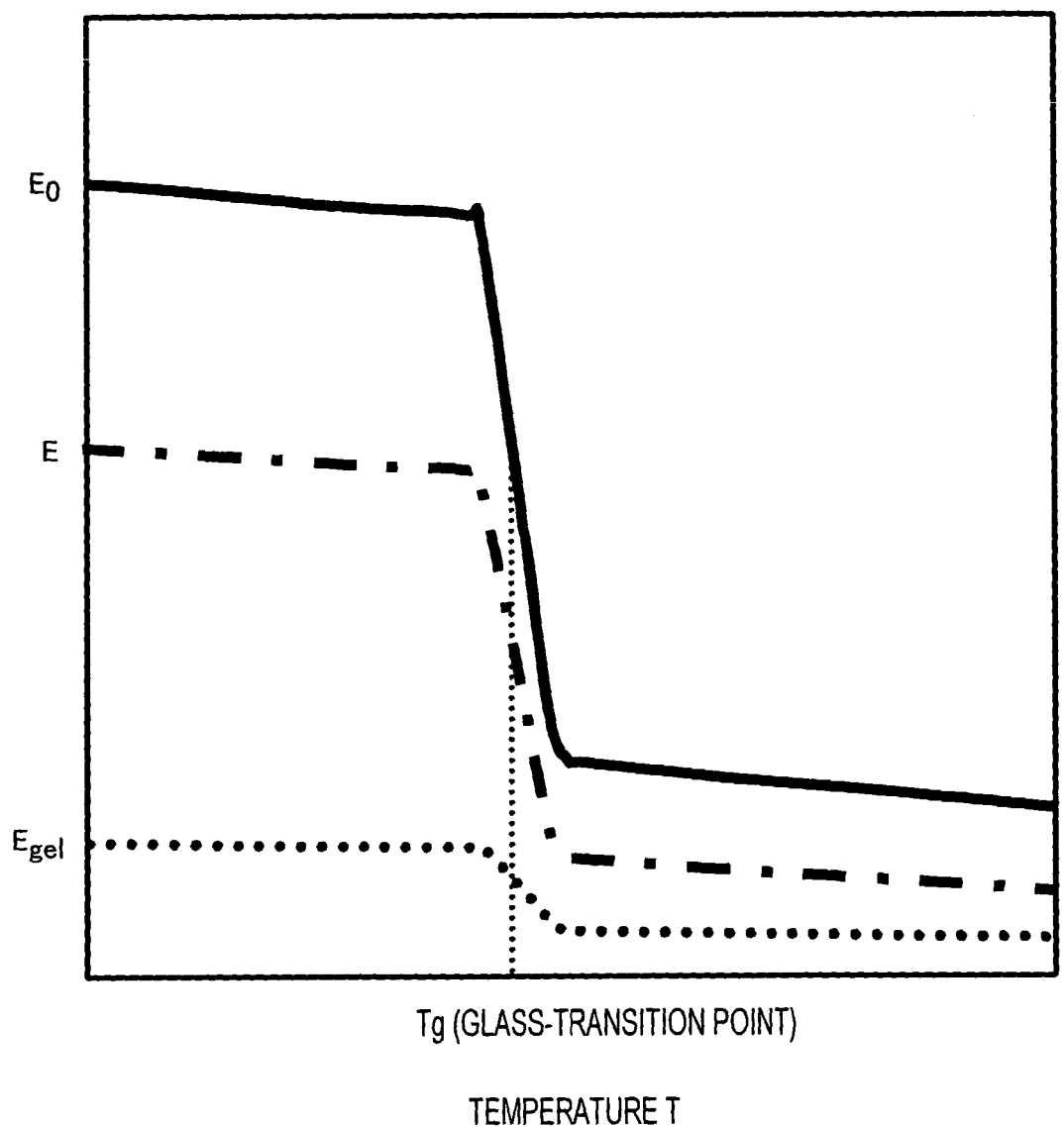
FIG. 10 is a diagram for explaining relation between change of temperature T and a coefficient of elasticity E in the case where a reaction rate A is constant.

On the other hand, when the reaction rate A is assumed to be constant, then, actually, the relation of the coefficient of elasticity E to change of temperature T is shown in FIG. 10. Here, $E_0$ refers to the coefficient of elasticity at the end of the reaction, and $E_{gel}$ refers to the coefficient of elasticity at gelling. As shown in the figure, the coefficient of elasticity changes as temperature changes in the course of resin flowing and as temperature changes according to cooling after flowing, showing a higher value at a temperature lower than the glass-transition temperature, and a lower value at a temperature higher than the glass-transition temperature.

Figure 11:
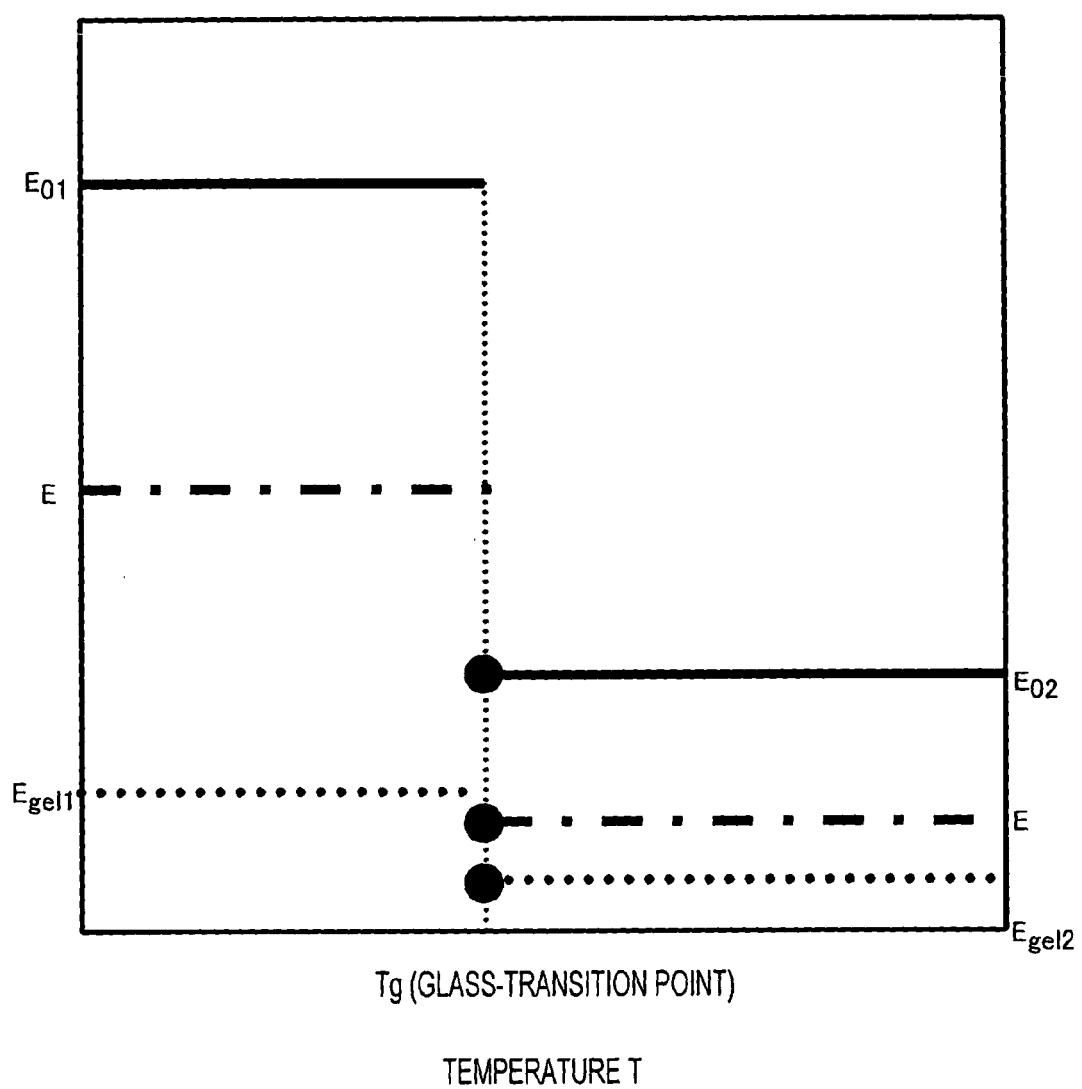
FIG. 11 is a diagram for explaining relation between change of temperature T and a coefficient of elasticity E in the case where a reaction rate A is constant.

However, change of the coefficient of elasticity E is small in each stage of temperature change before and after the glass-transition point as a dividing point. Accordingly, with a constant reaction rate A, the relation of the coefficient of elasticity E to change of temperature T can be simplified as shown in FIG. 11. In the figure, $E_{01}$ refers to the coefficient of elasticity at the end of the reaction in the case where temperature T is less than the glass-transition point $T_g$; $E_{02}$ to the coefficient of elasticity at the end of the reaction in the case where temperature T is more than or equal to the glass-transition point $T_g$; $E_{gel1}$ to the coefficient of elasticity at gelling in the case where temperature is less than the glass-transition point Tg; and $E_{gel2}$ to the coefficient of elasticity at gelling in the case where temperature T is more than or equal to the glass-transition point.

Thus, the coefficient of elasticity E can be expressed by Eq. 15 in the case where the temperature T is less than the glass-transition point $T_g$, and by Eq. 16 in the case where the temperature T is more than or equal to the glass-transition point $T_g$.

$$E=E_{gel1}+(E_{01}-E_{gel1})(A-A_{gel})/(1-A_{gel}) \qquad \text{Eq. 15}$$

$$E=E_{gel2}+(E_{02}-E_{gel2})(A-A_{gel})/(1-A_{gel}) \qquad \text{Eq. 16}$$

Here, the coefficient of elasticity $E_{01}$ at the end of the reaction in the case where the temperature T is less than the glass-transition point $T_g$, the coefficient of elasticity $E_{02}$ at the end of the reaction in the case where the temperature T is more than or equal to the glass-transition point $T_g$, the coefficient of elasticity $E_{gel1}$ at gelling in the case where the temperature T is less than the glass-transition point $T_g$, the coefficient of elasticity $E_{gel2}$ at gelling in the case where the temperature T is more than or equal to the glass-transition point $T_g$, and the reaction rate $A_{gel}$ at gelling are the thermosetting resin's physical property values received in the step S204. Further, the temperature T and the reaction rate A are the temperature and the reaction rate calculated for time t in the steps S206 and S206 or the below-described steps S217 and S218.

The above-described equations Eqs. 15 and 16 are the coefficient-of-elasticity change equations. For each first three-dimensional solid element in which gelling starts, the coefficient of elasticity E at the time of heat curing shrinkage is calculated by setting the reaction rate A at time t in these equations.

Next, for each first three-dimensional solid element in which gelling starts, the flow analysis unit 13 calculates a residual strain (stress) component ε at time t, using reaction curing shrinkage equations and a heat curing shrinkage equation (S212).

Figure 12:
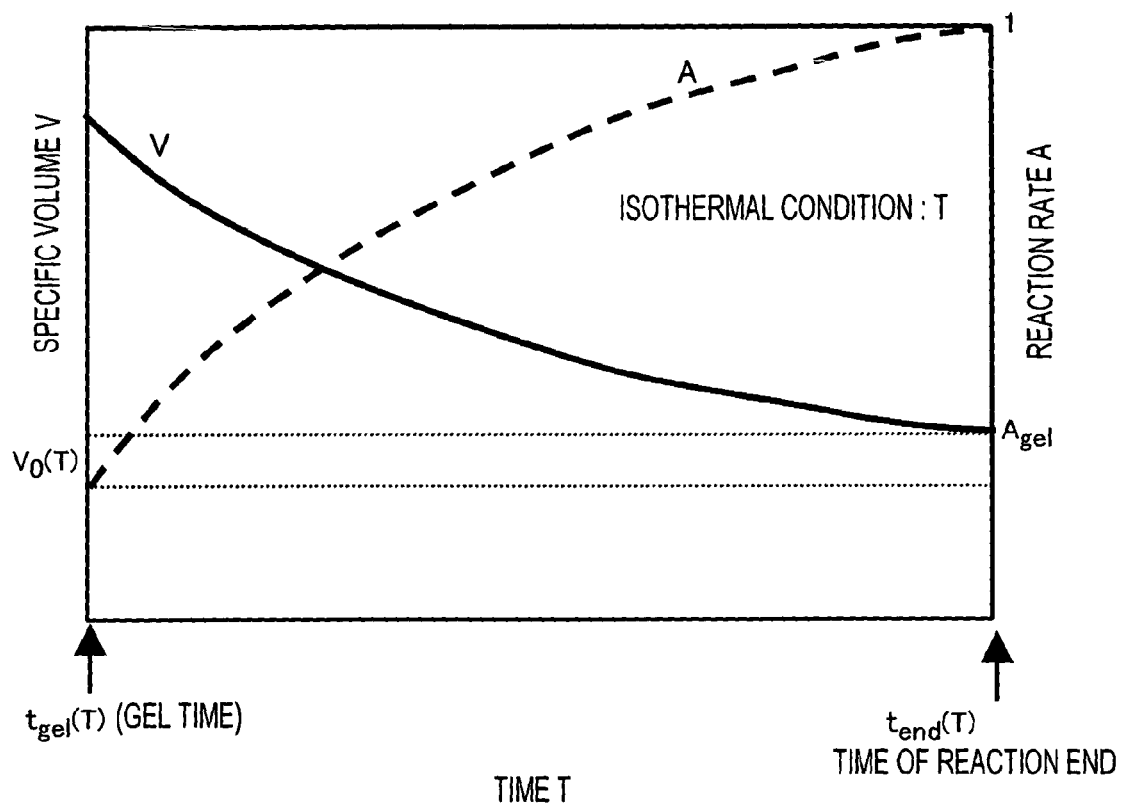
FIG. 12 is a diagram for explaining relations of a reaction rate A and a specific volume V after gelling to molding time.
Figure 13:
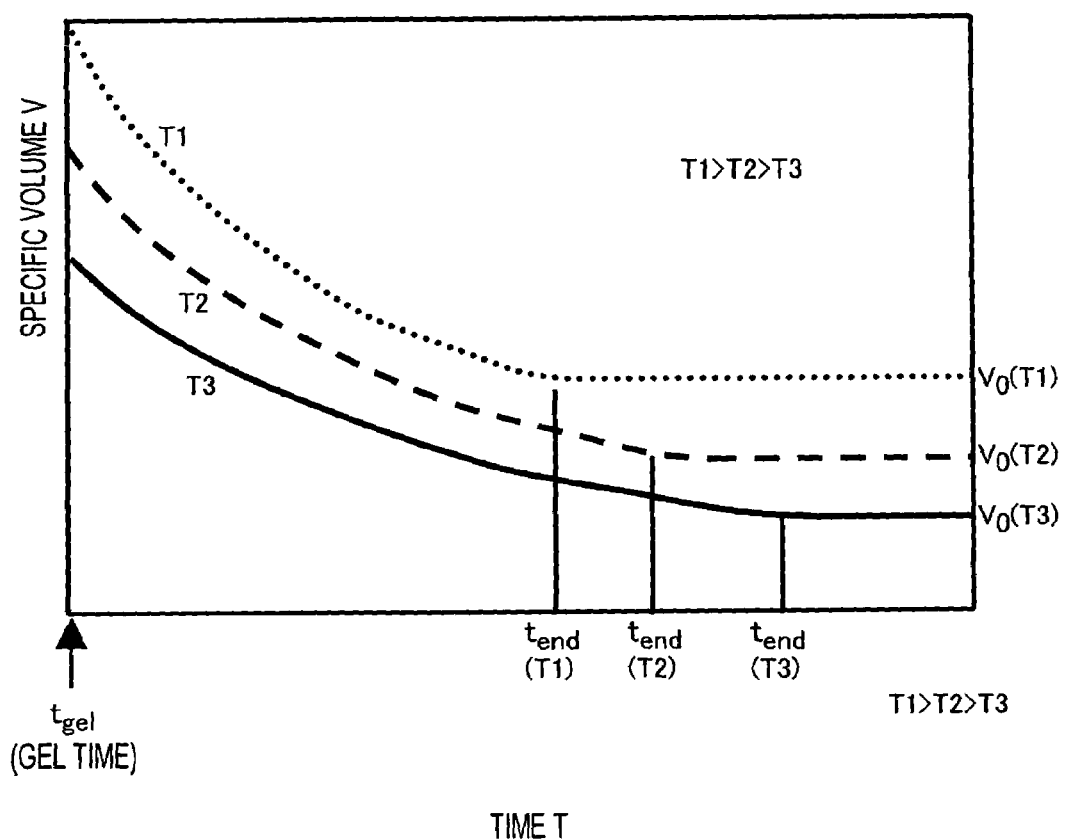
FIG. 13 is a diagram for explaining relations between a specific volume V and molding time at different resin temperatures (T1>T2>T3)

FIG. 12 is a diagram for explaining relations of the reaction rate A and the specific volume V after gelling to molding time. Further, FIG. 13 is a diagram for explaining relations between the specific volume V and molding time at different resin temperatures (T1>T2>T3).

Figure 14:
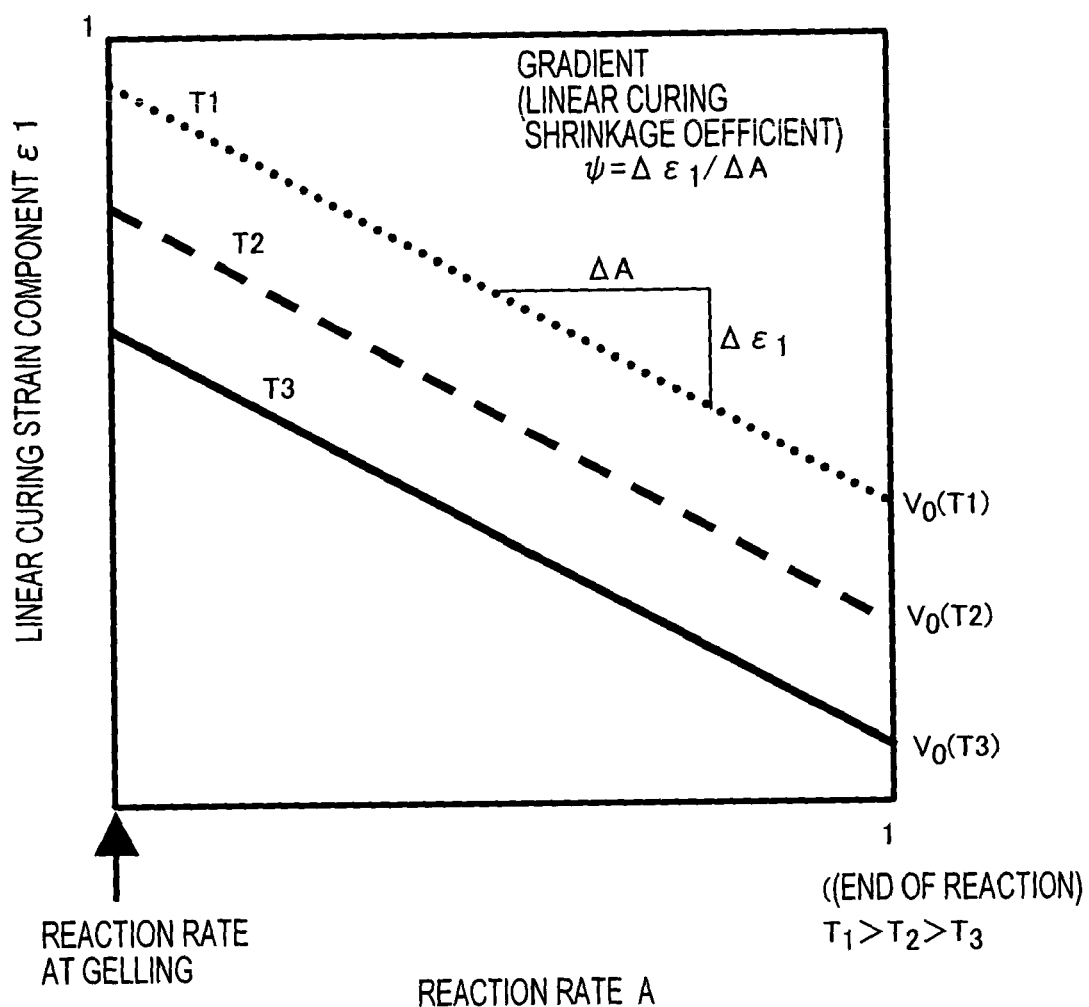
FIG. 14 is a diagram for explaining relation between a linear curing strain component ϵ1 and a reaction rate A.

As shown in FIG. 12, the specific volume V after gelling decreases in inverse proportion to increase of the reaction rate A. This change of the specific volume V is the cure shrinkage strain component due to reaction curing shrinkage. Further, with respect to change of the specific volume V with the lapse of time after gelling, it is shown in FIG. 13 that, as the resin temperature is higher, the reaction proceeds faster and the reaction end time tend comes earlier. Further, in the case of comparison at a same point of time, higher the resin temperature is, larger the specific volume V is. However, even if temperature is different, change of the specific volume V with the lapse of time is almost same. Such relation between the specific volume V and the reaction rate A after gelling can be simplified as a relation between a linear curing strain component ε1 and the reaction rate A as shown in FIG. 14.

In thermosetting resin molding, a strain component ε generated in each first three-dimensional solid element at the time of heat curing (the point D in FIG. 2) is expressed by Eq. 17 since the strain component ε is caused by shrinkage that is, in turn, caused by reaction curing and change in temperature after gelling.

$$\epsilon=\epsilon1+\epsilon2 \qquad \text{Eq. 17}$$

Here, ε1 refers to the linear curing strain component and ε2 to a temperature strain component.

Because of the relations shown in FIG. 14, the linear curing strain component ϵ1 can be obtained from reaction curing shrinkage equations shown as Eqs. 18–21.

$$\epsilon 1 = \phi \Delta A \qquad \text{Eq. 18}$$

$$\psi = (\tfrac{1}{3})(\phi/V_0(T_R)) \qquad \text{Eq. 19}$$

$$A(t_2, T_2) = ((K_1(T_2) + K_2(T_2)A(t_1, T_1)^M)(1 - A(t_1, T_1)))\Delta t + A(t_1, T_2) \qquad \text{Eq. 20}$$

$$\Delta A = A(t_2, T_2) - A_{gel} \qquad \text{Eq. 21}$$

Here, ψ refers to a linear curing shrinkage coefficient; ΔA to (the reaction rate at curing—the reaction rate at gelling); φ to a rate of change of the specific volume with respect to reaction rate; $T_R$ to the room temperature; $t_2$ to time t; $t_1$ to time before the time $t_2$ by a time step Δt; $T_1$ to the temperature at the time $t_1$; $T_2$ to the temperature at the time $t_2$; $V_0(T_R)$ to the specific volume at the end of the heat curing reaction; $A(t_1, T_1)$ to the reaction rate at the time $t_1$ and the temperature $T_1$; $A(t_2, T_2)$ to the reaction rate at the time $t_2$ and the temperature $T_2$; $K_1$ and $K_2$ to coefficients as functions of temperature; M to the intrinsic coefficients of the material; and $A_{gel}$ to the reaction rate at gelling. Among them, M and the reaction rate at gelling $A_{gel}$ are inputted in the step S204 as the physical property values of the resin. Further, the initial temperature is inputted in the step S205 as the various conditions. On the other hand, the temperature strain component ϵ2 can be obtained from Eq. 22.

$$\epsilon 2 = \alpha \Delta T \qquad \text{Eq. 22}$$

Here, α refers to the linear expansion coefficient; and ΔT to a temperature difference of the temperature calculated for time t in the steps S206 and S207 or the below-described steps S217 and S218 from the curing temperature.

Figure 15:
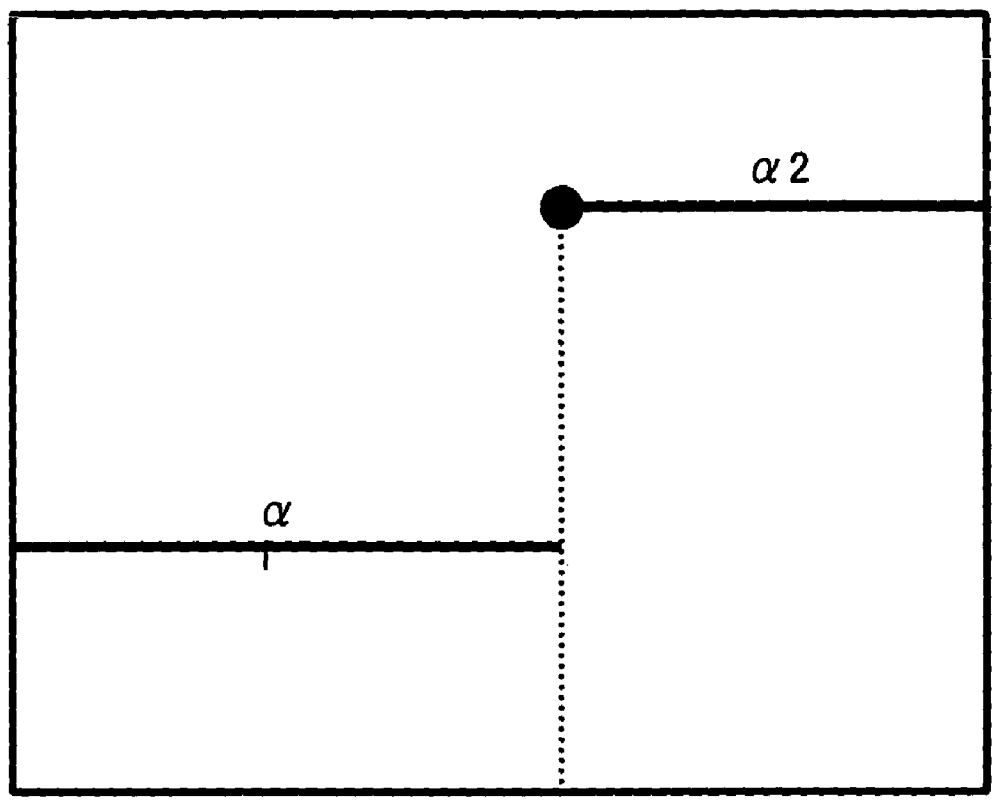
FIG. 15 is a diagram for explaining relation between a linear expansion coefficient α and temperature.

As shown in FIG. 15, the value of the linear expansion coefficient α changes about several times before and after the glass-transition point $T_g$ as a dividing point. Thus, it is necessary to change the linear expansion coefficient between the case where the curing temperature is higher than the glass transition point $T_g$ and the case where the curing temperature is lower than the glass transition point $T_g$. Further, it is necessary to change the equation of the temperature strain component (Eq. 22). The temperature strain component considering the effect of the glass-transition point can be obtained from heat curing equations shown as Eqs. 23–26.

In Eqs. 23–26, α1 refers to the linear expansion coefficient at a temperature lower than the glass-transition point; α2 to the linear expansion coefficient at a temperature higher than or equal to the glass-transition point; $T_g$ to the glass-transition temperature; and $T_1$ to a temperature at which residual strain is obtained, i.e., the temperature calculated for time t in the steps S206 and 207 or the below-described steps S217 and S218. Further, $T_{gel}$ refers to the gelling temperature, i.e., the temperature calculated in the steps S206 and S207 or the below-described steps S217 and S218 just before it is judged in the step S209 that gelling starts. Here, the linear expansion coefficients α1 and α2 and the glass-transition temperature $T_g$ are inputted in the step S204 as the physical property values of the resin.

(1) In the case where $T_1$, $T_{gel} \geq T_g$, then, the temperature strain component ϵ2 is obtained by Eq. 23.

$$\epsilon 2 = \alpha 2 \Delta T = \alpha 2(T_1 - T_{gel}) \qquad \text{Eq. 23}$$

(2) In the case where $T_1$, $T_{gel} \leq T_g$, then, the temperature strain component ϵ2 is obtained by Eq. 24.

$$\epsilon 2 = \alpha 1 \Delta T = \alpha 1(T_1 - T_{gel}) \qquad \text{Eq. 24}$$

(3) In the case where $T_1 > T_{gel} > T_g$, then, the temperature strain component ϵ2 is obtained by Eq. 25. In this case the strain is in the expanding direction.

$$\epsilon 2 = \alpha 2(T_1 - T_g) + \alpha 1(T_g - T_{gel}) \qquad \text{Eq. 25}$$

(4) In the case where $T_{gel} > T_g > T_1$, then, the temperature strain component ϵ2 is obtained by Eq. 26. In this case the strain is in the shrinking direction.

$$\epsilon 2 = \alpha 2(T_g - T_{gel}) + \alpha 1(T_1 - T_g) \qquad \text{Eq. 26}$$

Thus, among Eqs. 23–26, the flow analysis unit 13 selects an equation that satisfies the conditions of the gelling temperature, the curing temperature and the glass-transition temperature of the thermosetting resin, and uses the selected equation to obtain a temperature strain component ϵ2.

Now, when the flow analysis unit 13 calculates thus the coefficient of elasticity E and the strain component ϵ for time t for every first three-dimensional solid element in which gelling occurs, then, the flow analysis unit 13 judges whether the three-dimensional analysis area has been completely filled with the thermosetting resin, based on, for example, the flow end position calculated in the step S208 for each first three-dimensional solid element (S213). When the area has not been completely filled, then time t is advanced by a time step Δt (S214) before returning to the step S206. On the other hand, filling is finished, the flow analysis unit 13 judges whether time t reaches molding end time (S215).

Here, the molding end time is inputted in the step S205 as one of the various conditions. It is necessary to set the molding end time as a time sufficient for heat curing of all the first three-dimensional solid elements.

When it is judged in S215 that time t does not reach the molding end time yet, then, the flow analysis unit 13 advances time t by a time step Δt (S217), and calculates various data (a reaction rate, viscosity, temperature, flow velocity and pressure) of each first three-dimensional solid element, similarly to the above-described steps S206 and S207 (S217 and S218), before returning to the step S209 to continue the processing.

On the other hand, when it is judged in S215 that time t reaches the molding end time, then, it is considered that the coefficient of elasticity and strain component at the molding end time have been calculated for almost every first three-dimensional solid element. These coefficient of elasticity and strain component correspond to the coefficient of elasticity and strain component at the time of the heat curing shrinkage. As flow analysis results for each time step Δt and for each first three-dimensional solid element, the flow analysis unit 13 stores the reaction rate, viscosity, temperature, flow velocity, pressure, and flow end position into a storage unit such as the memory. Further, for each first three-dimensional solid element, the flow analysis unit 13 stores the temperature, coefficient of elasticity and strain component at the time of the heat curing shrinkage, as input values to use in the residual strain (stress) calculation processing (S3), into a storage unit such as the memory, and then, ends this three-dimensional flow analysis processing (S2).

Further, the flow analysis unit 13 presents the flow analysis results to the user through the GUI unit 11. An example of the flow analysis results is shown in FIGS. 16–20.

Figure 16:
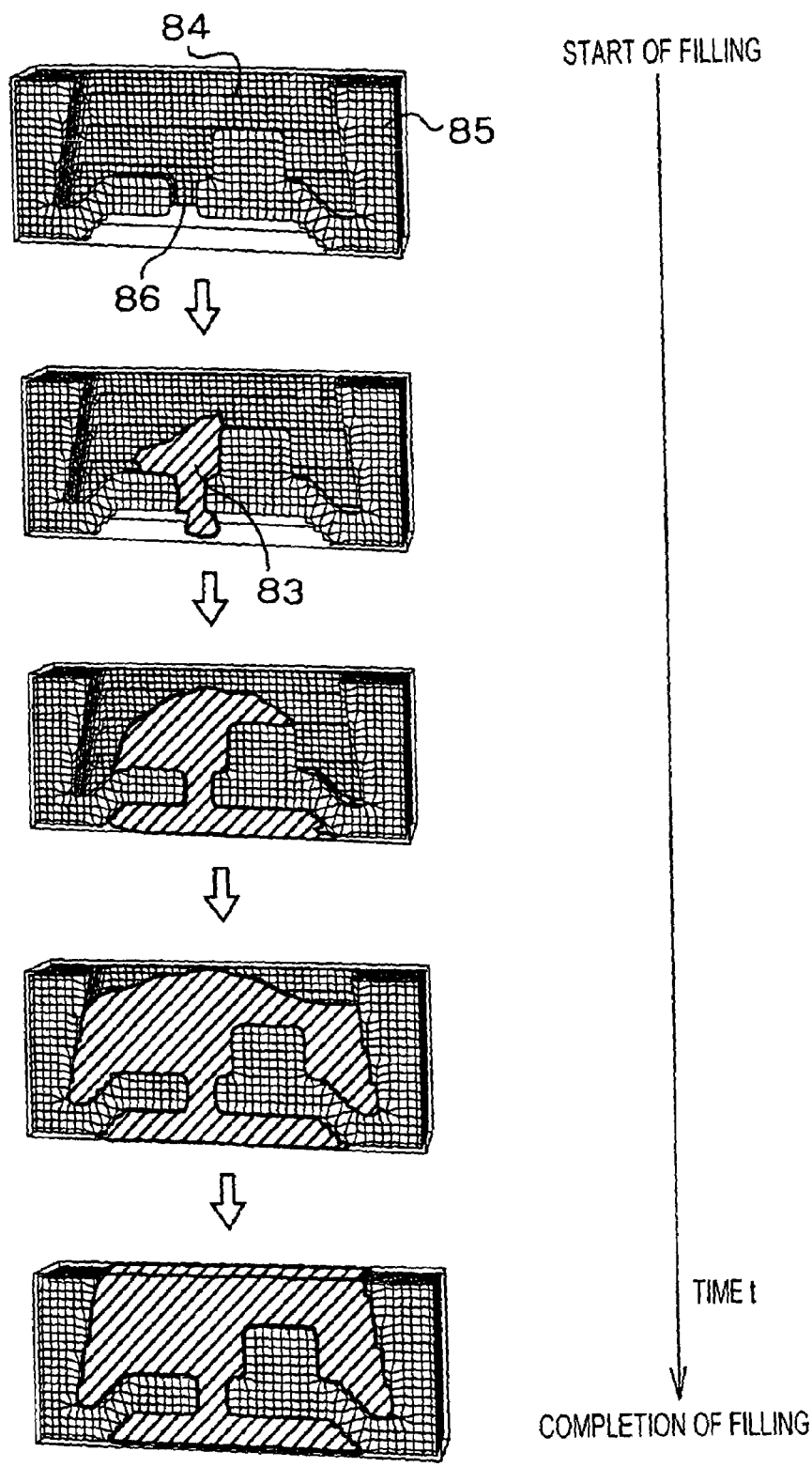
FIG. 16 shows distribution diagrams indicating states of a resin flow from the start to completion of filling of thermosetting resin into a three-dimensional analysis area.
Figure 17:
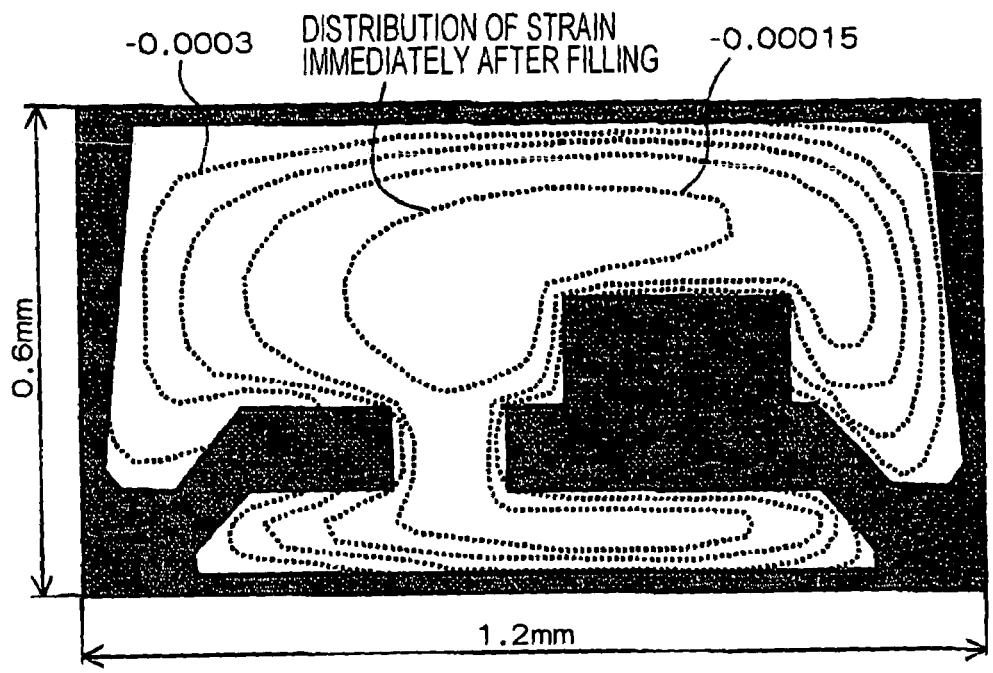
FIG. 17 is a distribution diagram showing a state of strain components at the completion of resin filling.
Figure 18:
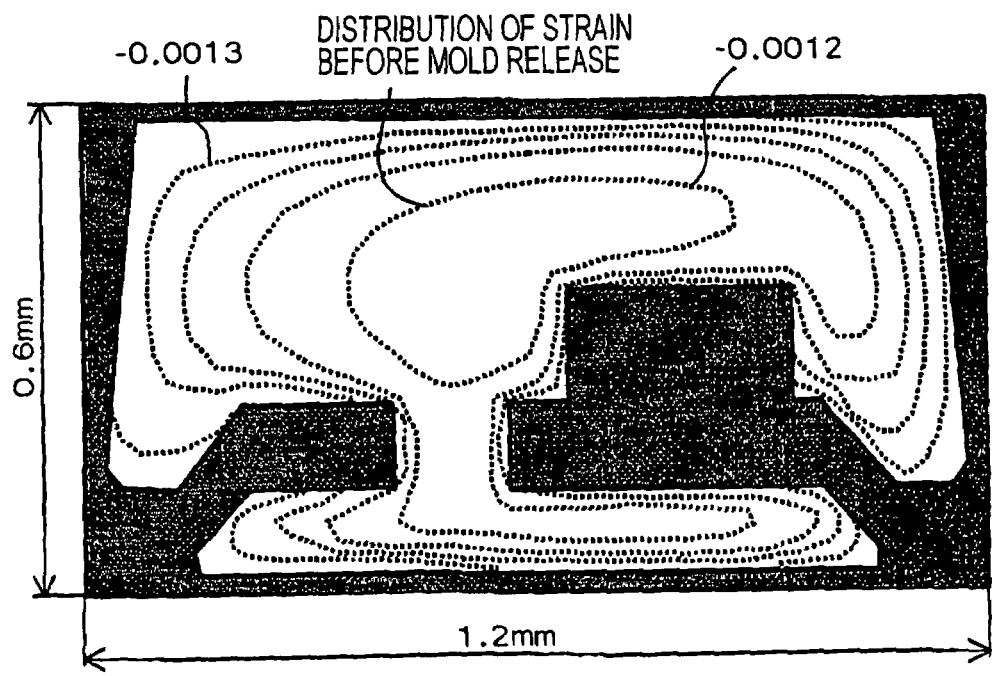
FIG. 18 is a distribution diagram showing a state of strain components at the end of heat curing.
Figure 19:
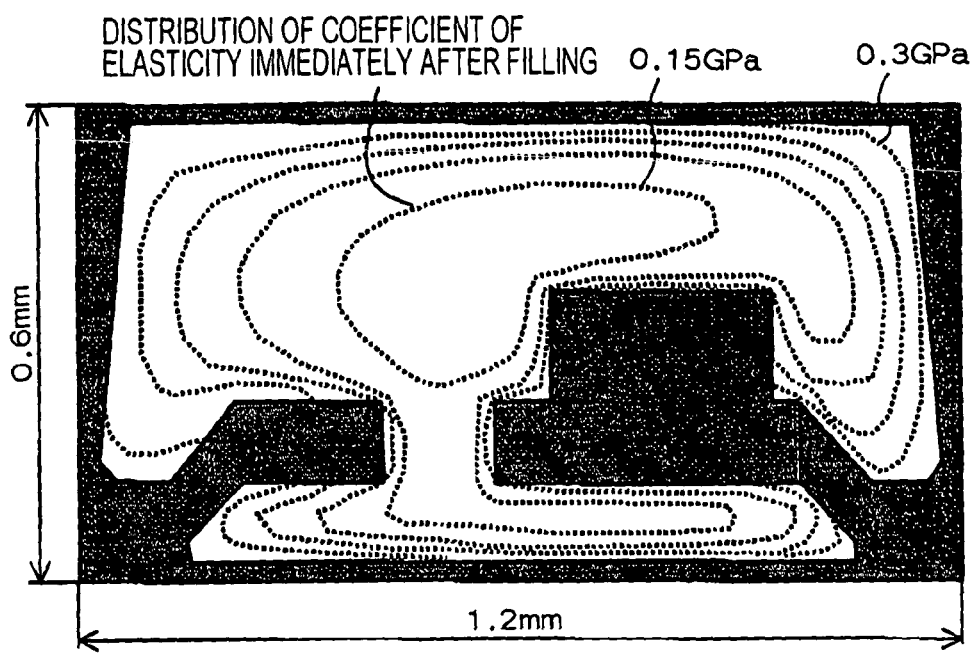
FIG. 19 is a distribution diagram showing a state of coefficients of elasticity at the completion of resin filling.
Figure 20:
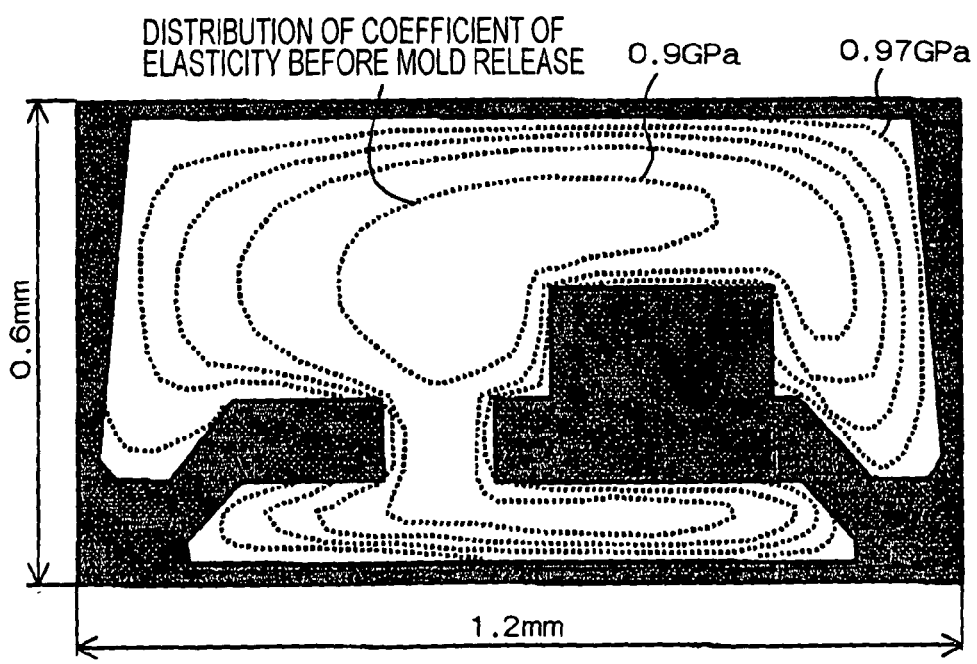
FIG. 20 is a distribution diagram showing a state of coefficients of elasticity at the end of heat curing.

FIG. 16 shows distribution diagrams indicating states of a resin flow from the start to completion of filling of the thermosetting resin. Here, the reference numeral 85 refers to the mold; 84 to the mold cavity as the three-dimensional analysis area; 86 to the resin injection hole (nozzle); and 83 to the injected thermosetting resin. FIGS. 17 and 18 are distribution diagrams showing states of strain components at the completion of resin filling and at the end of the heat curing, respectively. And, FIGS. 19 and 20 are distribution diagrams showing states of coefficients of elasticity at the completion of resin filling and at the end of the heat curing, respectively.

Next, there will described the residual strain (stress) calculation processing performed in the step S3.

Figure 21:
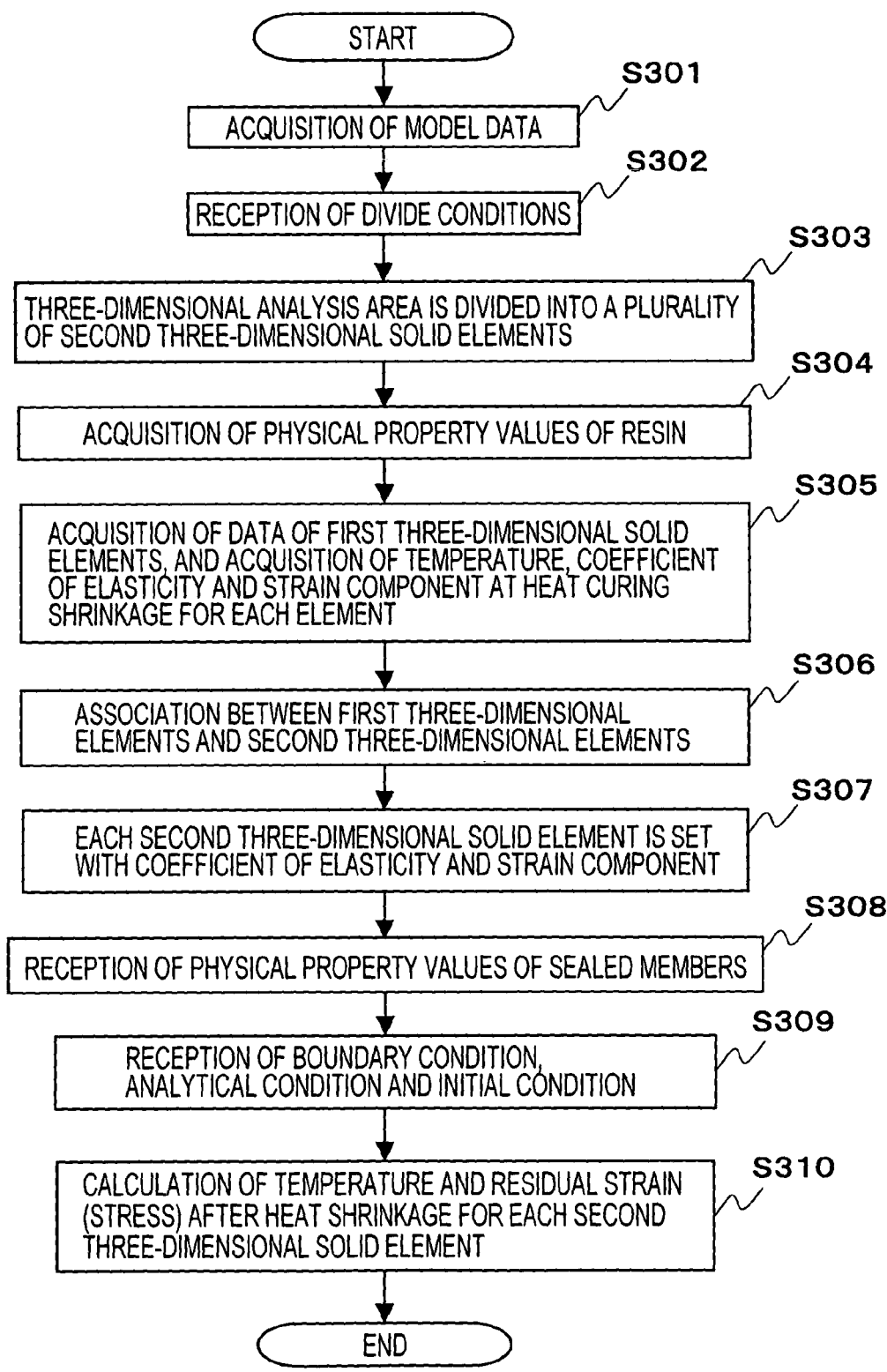
FIG. 21 is a flowchart for explaining residual strain (stress) calculation processing in an embodiment of the present invention.

FIG. 21 is a flowchart for explaining the residual strain (stress) calculation processing.

When the residual strain (stress) estimation unit 14 receives an instruction of residual strain calculation from the user through the GUI unit 11, then, the residual strain (stress) estimation unit 14 receives designation of model data from the user through the GUI unit 11. Then, the designated model data are acquired from the model generation unit 12 (S301).

Next, the residual strain (stress) estimation unit 14 sets an area occupied by a resin mold product, as a three-dimensional analysis area in the finite element method. The occupied area is specified by the acquired model data. Then, conditions (the number of division, element size, and the like) for dividing this three-dimensional analysis area into a plurality of second three-dimensional solid elements are received from the user through the GUI unit 11 (S302). The residual strain (stress) estimation unit 14 divides the three-dimensional analysis area into the plurality of second three-dimensional solid elements, according to the received divide conditions (S303).

Next, the residual strain (stress) estimation unit 14 receives designation of the flow analysis results from the user through the GUI unit 11. Then, the thermosetting resin's physical property values used for obtaining the designated flow analysis results are acquired from the flow analysis unit 13 (S304). Further, the data of each first three-dimensional solid element used for obtaining the designated flow analysis results and the temperature, coefficient of elasticity and strain component at the time of the heat curing shrinkage of each first three-dimensional solid element are acquired from the flow analysis unit 13 (S305).

Next, the residual strain (stress) estimation unit 14 associates each of the second three-dimensional solid elements generated in the step S303 with the data (which are acquired from the flow analysis unit 13 in the step S305) of at least one first three-dimensional solid element (S306).

For example, a representative point (for example, a center of gravity) is set for each of the first and second three-dimensional solid elements. Then, for each second three-dimensional solid element, a predetermined number of first three-dimensional solid elements are selected in the order of nearest representative point. And, the selected first three-dimensional solid elements are associated with the second three-dimensional solid element in question.

Next, for each second three-dimensional solid element, the residual strain (stress) estimation unit 14 sets temperature, a coefficient of elasticity and a strain component to the second three-dimensional solid element in question, based on the temperature, the coefficient of elasticity and the strain component of each first three-dimensional solid element associated with the second three-dimensional solid element in question (S307).

For example, for each second three-dimensional solid element, respective averages of the temperatures, coefficients of elasticity and strain components of the first three-dimensional solid elements associated with the second three-dimensional solid element in question are calculated, weighting those values according to respective distances of the representative points of those first three-dimensional solid elements from the representative point of the second three-dimensional solid element in question. Then, the calculation results are set to the second three-dimensional solid element in question.

Next, from the user through the GUI unit 11, the residual strain (stress) estimation unit 14 receives the sealed members' physical property values required for the three-dimensional strength analysis and for calculation of residual strain (stress) (S308). For example, in the case where the resin mold product as the object of the analysis is a diode package as shown in FIG. 1, then, at least, coefficients of elasticity, Poisson's ratios, yield stresses, coefficients of expansion, thermal conductivities, specific heats and densities of the frames 91 and the pellet 92 are received as the physical property values of the frames 91 and the pellet 92.

Next, the residual strain (stress) estimation unit 14 receives various conditions (a boundary condition, an analytical condition and an initial condition) for calculation of residual strain (stress), from the user through the GUI unit 11 (S309). The boundary condition includes a contact state between the resin mold product and the outside, and an area in which displacement is restricted, in the course of taking out the product from the mold and of cooling the product. The analytical condition includes a cooling velocity, temperature at the end of the analysis (final temperature at the end of the heat shrinkage), and the like.

When thus the coefficient of elasticity and strain component are set to each second three-dimensional solid element, and the data (the physical property values of each component of the resin mold product and the various conditions) required for the three-dimensional strength analysis are set, then, the residual strain (stress) estimation unit 14 calculates residual strain (stress) for each second three-dimensional solid element at the end of heat shrinkage, using thus-set strain (stress) component and coefficient of elasticity and using a variation of the coefficient of elasticity in the case of cooling from the heat curing temperature to the room temperature. Here, the variation of the coefficient of elasticity is determined by the temperature dependency of the coefficient of elasticity of the thermosetting resin (S310).

First, the residual strain (stress) estimation unit 14 set time t to an initial time. Then, for each second three-dimensional solid element, the residual strain (stress) estimation unit 14 calculates residual strain (stress) at the time t, using the temperature, residual strain component and coefficient of elasticity set for the second three-dimensional solid element in question immediately after the heat curing shrinkage, and using Eq. 27.

Here, E refers to the coefficient of elasticity (Young's $$\begin{Bmatrix} \sigma x \\ \sigma y \\ \sigma z \\ \sigma xy \\ \sigma yz \\ \sigma zx \end{Bmatrix} = \frac{E}{1-v^2} \begin{bmatrix} 1 & v & v & 0 & 0 & 0 \\ v & 1 & v & 0 & 0 & 0 \\ v & v & 1 & 0 & 0 & 0 \\ 0 & 0 & 0 & \frac{1-v}{2} & 0 & 0 \\ 0 & 0 & 0 & 0 & \frac{1-v}{2} & 0 \\ 0 & 0 & 0 & 0 & 0 & \frac{1-v}{2} \end{bmatrix} \begin{Bmatrix} \varepsilon_x + \varepsilon_{x0} \\ \varepsilon_y + \varepsilon_{y0} \\ \varepsilon_z + \varepsilon_{z0} \\ \gamma_{xy} + \gamma_{xy0} \\ \gamma_{yz} + \gamma_{yz0} \\ \gamma_{zx} + \gamma_{zx0} \end{Bmatrix} \quad \text{Eq. 27}$$

-continued $$= [D] \begin{Bmatrix} \varepsilon_x + \varepsilon_{x0} \\ \varepsilon_y + \varepsilon_{y0} \\ \varepsilon_z + \varepsilon_{z0} \\ \gamma_{xy} + \gamma_{xy0} \\ \gamma_{yz} + \gamma_{yz0} \\ \gamma_{zx} + \gamma_{zx0} \end{Bmatrix}$$

modulus); ν to the Poisson's ratio; and $\varepsilon_{x0}$, $\varepsilon_{y0}$, $\varepsilon_{z0}$, $\gamma_{xy0}$, $\gamma_{yz0}$ and $\gamma_{zx0}$ to residual strain components after heat curing shrinkage.

As described above, a value of a coefficient of elasticity changes as temperature changes. Accordingly, for each second three-dimensional solid element, temperature at time t is calculated based on the temperature set for that second three-dimensional solid element immediately after the heat curing shrinkage and the thermosetting resin's cooling velocity received in the step S309. Then, depending on whether the calculated temperature is less than the glass-transition point $T_g$ or not, the coefficient of elasticity is calculated using the above Eq. 15 or 16. This coefficient of elasticity is used in Eq. 27. Here, in Eq. 15 or 16, the reaction rate A is set to a predetermined value sufficient for judging that the heat curing reaction is ended.

Next, for each second three-dimensional solid element, the residual strain (stress) estimation unit 14 judges whether temperature at time t falls to the temperature at the end of the analysis. The temperature at the end of the analysis is received in the step S309. For a second three-dimensional solid element whose temperature falls to the temperature at the end of the analysis, the residual strain (stress) calculated for that temperature is set as the final residual strain (stress) (after the heat shrinkage) of that second three-dimensional solid element. On the other hand, for a second three-dimensional solid element whose temperature does not fall to the temperature at the end of the analysis, time t is advanced by a time step Δt, and then, the residual strain (stress) calculation processing is repeated for that time t. As a result, for every second three-dimensional solid element, the final residual strain (stress) is calculated and set, and the residual strain (stress) calculation processing (S3) is ended.

Figure 22:
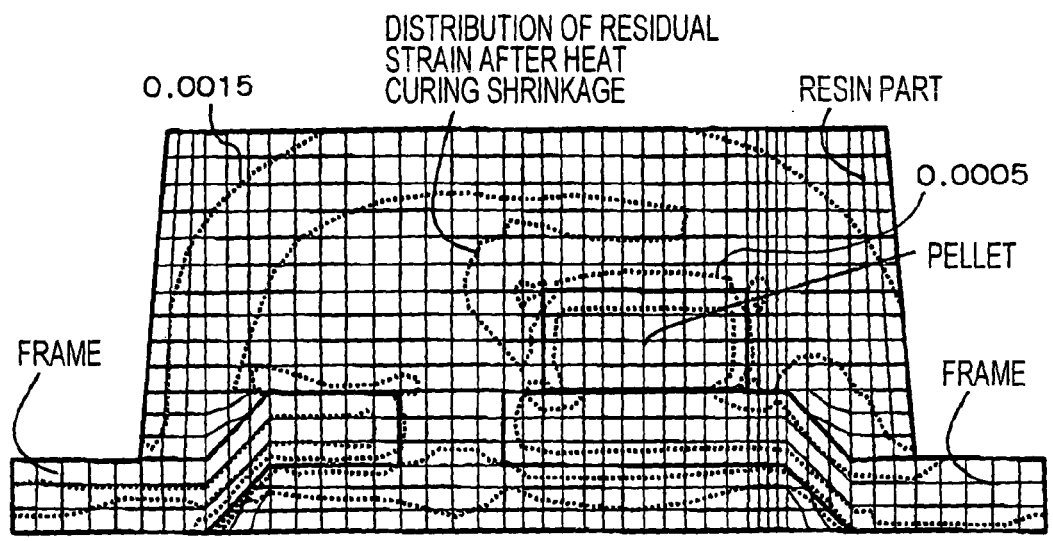
FIG. 22 is a distribution diagram showing a distribution of residual strain immediately after the heat curing shrinkage.
Figure 23:
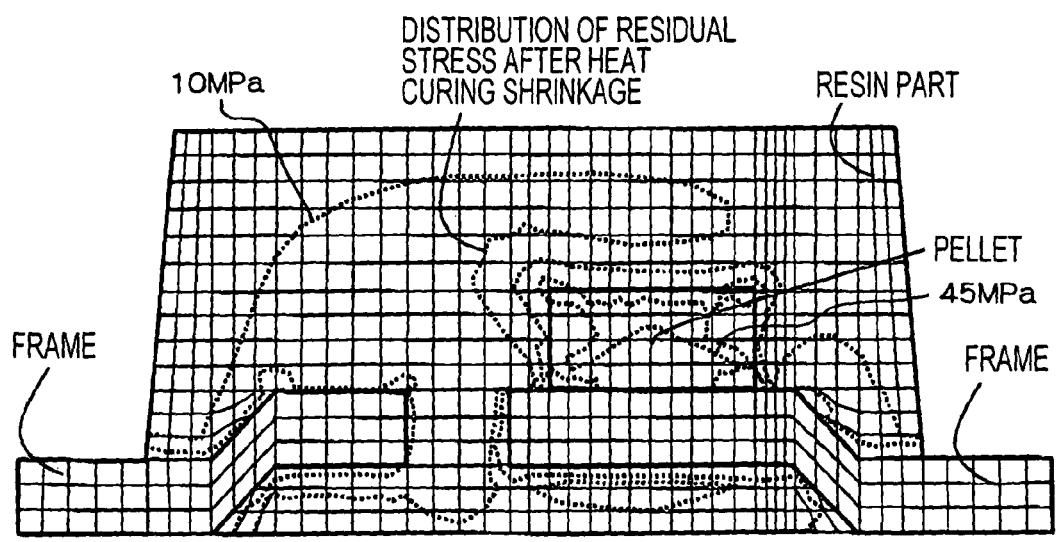
FIG. 23 is a distribution diagram showing a distribution of residual stress immediately after the heat curing shrinkage.
Figure 24:
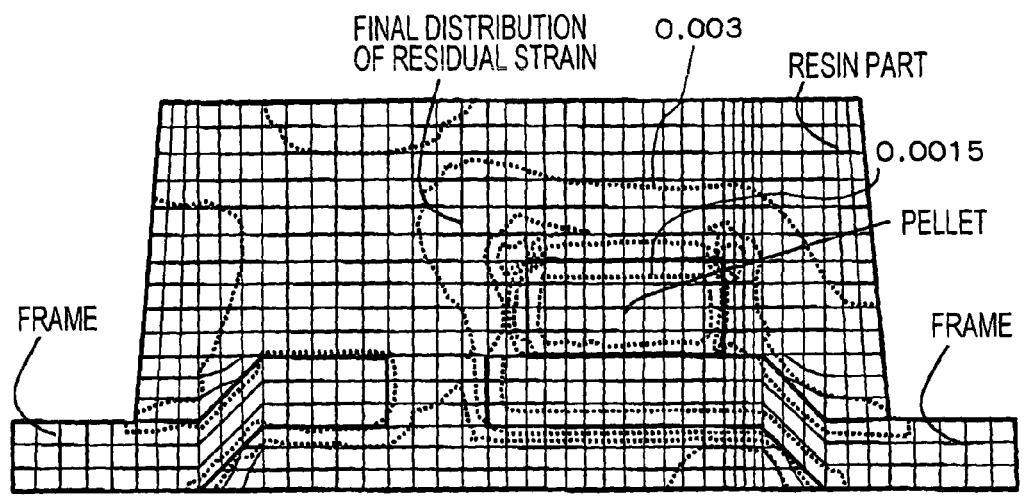
FIG. 24 is a distribution diagram showing a distribution of final residual strain (after the heat shrinkage)
Figure 25:
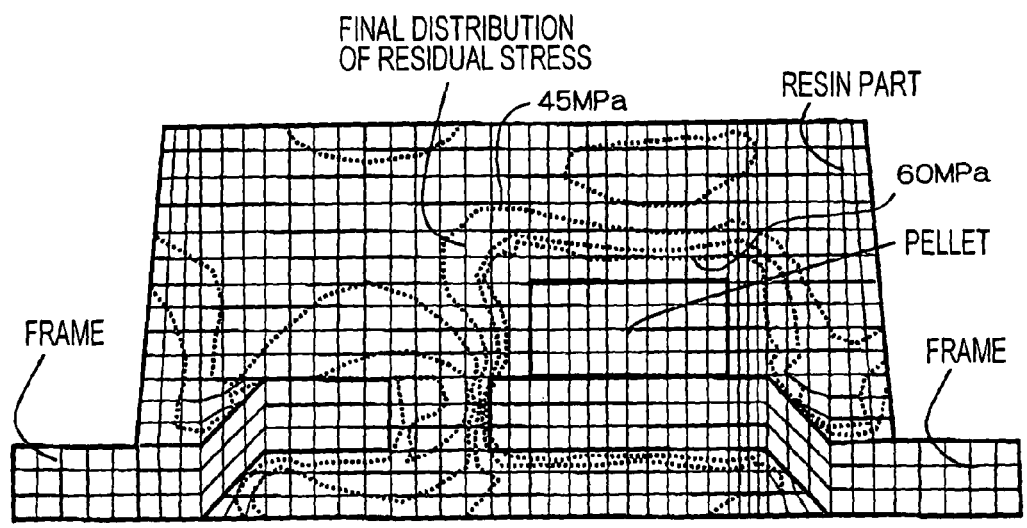
FIG. 25 is a distribution diagram showing a distribution of final residual stress (after the heat shrinkage)

The residual strain (stress) estimation unit 14 presents processes and results of the calculation of residual strain (stress) to the user through the GUI unit 11. FIGS. 22–25 show examples of processes and results of the calculation of residual strain (stress). FIGS. 22 and 23 are distribution diagrams showing respectively distributions of residual strain and residual stress immediately after the heat curing shrinkage. And, FIGS. 24 and 25 are distribution diagrams showing respectively distributions of final residual strain and final residual stress (after the heat shrinkage).

Next, the three-dimensional strength analysis processing performed in the step S4 will be described.

Figure 26:
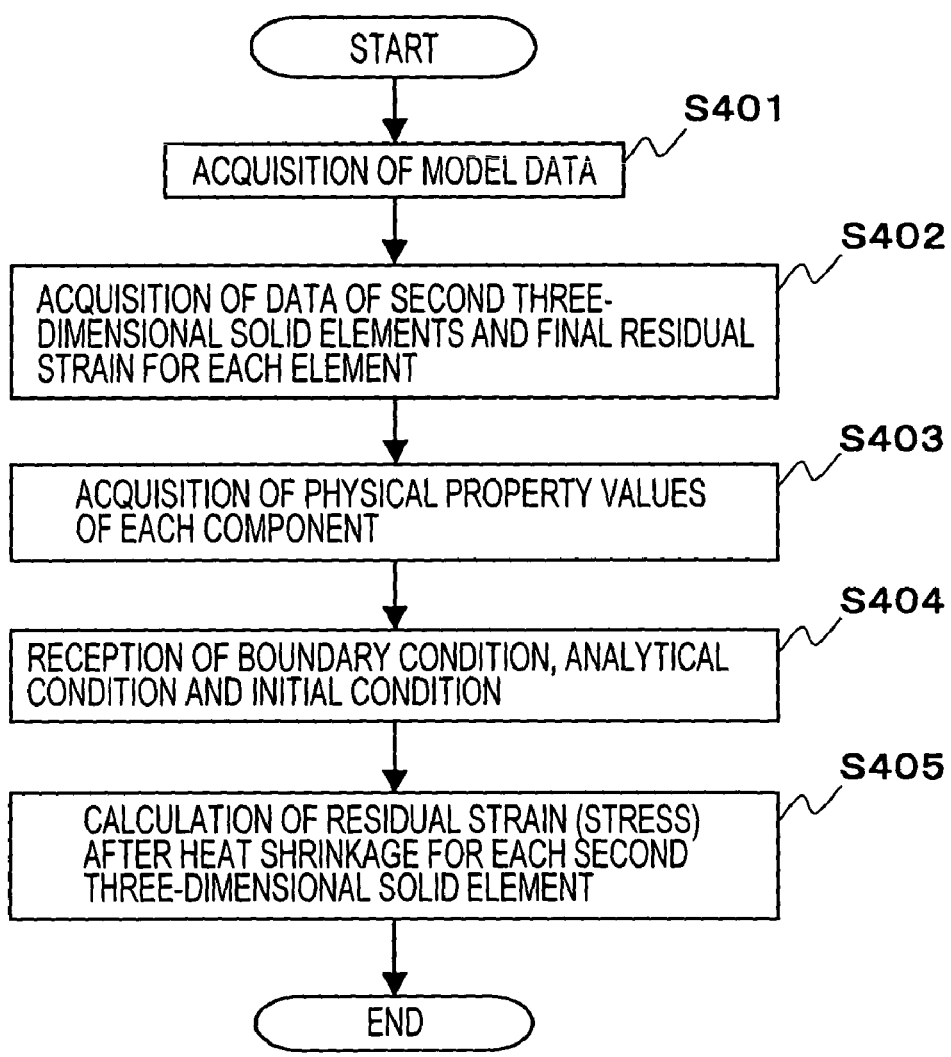
FIG. 26 is a flowchart for explaining three-dimensional strength analysis processing in an embodiment of the present invention.

FIG. 26 is a flowchart for explaining the three-dimensional strength analysis processing.

When the strength analysis unit 15 receives an instruction of three-dimensional strength analysis from the user through the GUI unit 11, then, the strength analysis unit receives designation of model data from the user through the GUI unit 11. Then, the designated model data are acquired from the model generation unit 12 (S401).

Next, the strength analysis unit 15 receives designation of residual strain (stress) calculation result, from the user through the GUI unit 11. Then, data of each second three-dimensional solid element used for calculating the designated residual strain (stress) result and the final residual strain (stress) (after the heat shrinkage) of each second three-dimensional solid element are acquired from the residual strain (stress) estimation unit 14 (S402). Further, the physical property values of each component (i.e., the thermosetting resin, the frame, or the pellet, in the case of the example shown in FIG. 1) of the resin mold product, i.e., the physical property values used for calculating the designated residual strain (stress), are acquired from the residual strain (stress) estimation unit 14 (S403).

Next, the strength analysis unit 15 receives various conditions (a boundary condition, an analytical condition and an initial condition) for the three-dimensional strength analysis from the user through the GUI unit 11 (S404). The various conditions include conditions such as heat and load that are expected to occur when the product is used.

Now, the strength analysis unit 15 sets the residual strain (stress) to each second three-dimensional solid element whose data are acquired in the step S402, and also sets each component's physical property values acquired in the step S403. Then, the three-dimensional strength analysis is performed according to the various conditions received in the step S404 (S405). This three-dimensional strength analysis is similar to the conventional one except that the residual strain (stress) is set to each second three-dimensional solid element.

Figure 27:
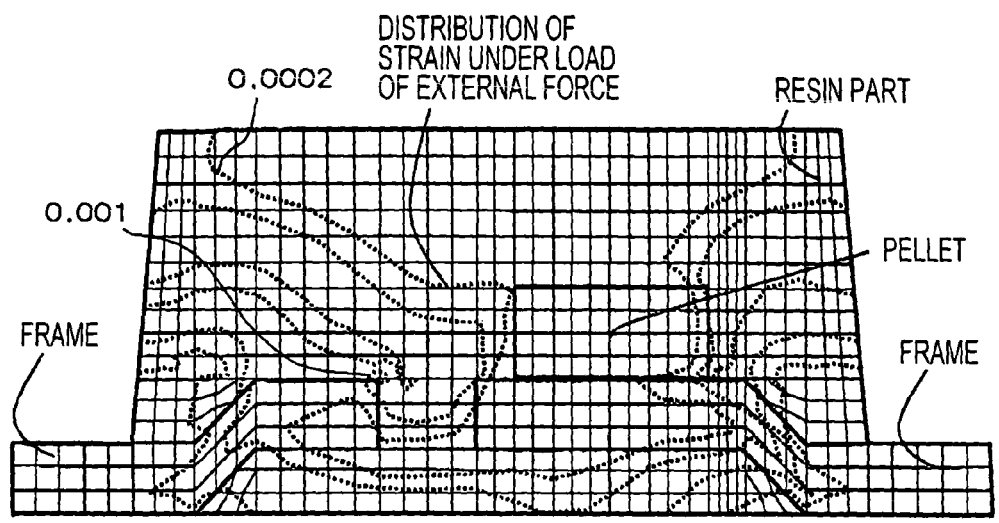
FIG. 27 is a distribution diagram showing a distribution of strain in a resin mold product in the case where force is applied to the resin mold product under various conditions.
Figure 28:
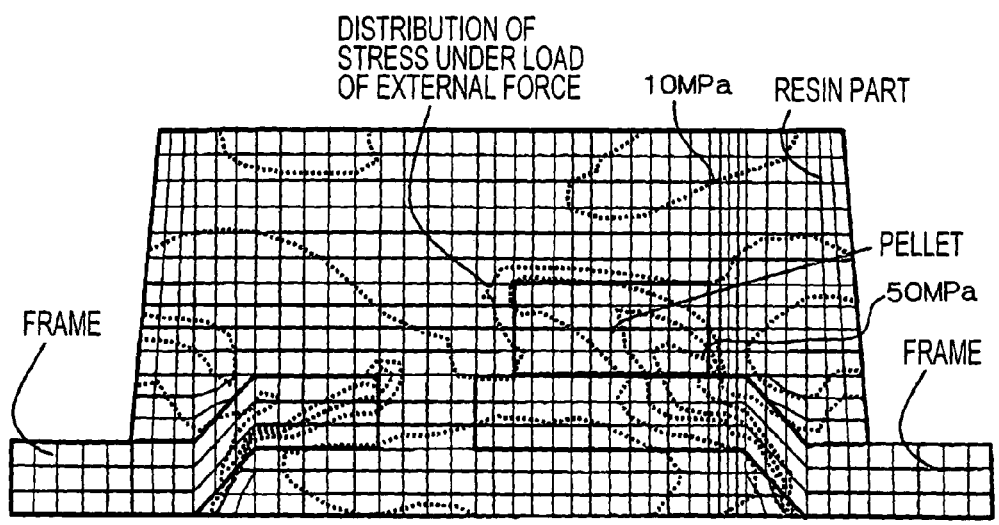
FIG. 28 is a distribution diagram showing a distribution of stress in a resin mold product in the case where force is applied to the resin mold product under various conditions.

The strength analysis unit 15 presents the results of the three-dimensional strength analysis to the user through the GUI unit 11. FIGS. 27 and 28 are distribution diagrams respectively showing distributions of strain and stress of the resin mold product in the case where force is applied to the product under the various conditions.

Hereinabove, one embodiment of the present invention has been described.

In the present embodiment, the flow analysis unit 13 calculates the coefficient of elasticity and strain component at the time of the heat curing of the thermosetting resin, for each first three-dimensional solid element used in the three-dimensional flow analysis. Further, the residual strain (stress) estimation unit 14 sets a coefficient of elasticity and strain component to each second three-dimensional solid element used in the three-dimensional strength analysis, using the correspondence between each second three-dimensional solid element and each first three-dimensional solid element, and using the coefficient of elasticity and strain component obtained by the flow analysis unit 13 for each first three-dimensional solid element. Then, the residual strain (stress) estimation unit 14 calculates the residual strain after the heat shrinkage, for each second three-dimensional solid element. Then, the strength analysis unit 15 sets the residual strain (stress) obtained by the residual strain (stress) estimation unit 14, to each second three-dimensional solid element, and analyzes the strength of the resin mold product.

Thus, according to the present embodiment, the residual strain due to the cure shrinkage and heat shrinkage is set to each second three-dimensional solid element, and, the strength of a resin mold product is analyzed by the finite element method using such second three-dimensional solid elements. As a result, it is possible to predict the strength of a resin mold product more accurately than the conventional technique.

The present invention is not limited to the above-described embodiment, and can be varied variously within the gist of the invention.

For example, the above embodiment has been described taking the example where residual strain of thermosetting resin is obtained. However, in addition to residual strain, or instead of residual strain, residual stress may be obtained. And, the three-dimensional strength analysis may be performed by setting residual stress to each second three-dimensional solid element.

Further, in the above embodiment, the programs for implementing the model generation unit 12, the flow analysis unit 13, the residual strain (stress) estimation unit 14 and the strength analysis unit 15 may be provided as separate pieces of software or in one package. Further, the program for implementing the residual strain (stress) estimation unit 14 may be provided being included in the program for implementing the strength analysis unit 15.

As described above, according to the present invention, it is possible to predict accurately strength of a resin mold product made of thermosetting resin.

What is claimed is:

1. A design support apparatus for a resin mold product made of thermosetting resin, comprising:
   a flow analysis means which analyzes a flow of thermosetting resin injected into a resin filling cavity to mold said resin mold product, using a finite difference method or a finite element method;
   a residual strain calculation means which calculates residual strain of the thermosetting resin after heat shrinkage of the thermosetting resin injected into the resin filling cavity to mold said resin mold product; and
   a strength analysis means which analyzes strength of said resin mold product, using a finite element method;
   wherein:
   said flow analysis means indicates a reaction rate model by using a reaction rate A;
   wherein A is an index of reaction progress extent whose initial value at the reaction is 0, and the change rate of A ($\partial A/\partial t$) in the initial period is relatively high in comparison to a rate during times after the initial period, and the reaction rate A is saturated toward 1 with lapse of time;
   and calculates viscosity $\eta$, coefficient of elasticity E, and linear curing strain component $\epsilon 1$ by replacing the changes of each component with change of the reaction rate A;
   said flow analysis means calculates a temperature, a coefficient of elasticity and a strain component of the thermosetting resin at a time of heat curing, for each of first three-dimensional solid elements used for flow analysis and gives the calculated result to the residual strain calculation means;
   said residual strain calculation means uses correspondence between each of second three-dimensional solid elements used for strength analysis by said strength analysis means and each of said first three-dimensional solid elements, and the temperature, the coefficient of elasticity and the strain component calculated for each of said first three-dimensional solid elements by said flow analysis means, in order to set a temperature, a coefficient of elasticity and a strain component at the time of heat curing for each of the second three-dimensional solid elements, and calculates residual strain after the heat shrinkage for each of said second three-dimensional solid elements; and
   said strength analysis means sets the residual strain after the heat shrinkage, which is calculated by said residual strain calculation means, to said each of said second three-dimensional solid elements, and analyzes the strength of said resin mold product.

2. The design support apparatus for a resin mold product, according to claim 1, wherein:
   said flow analysis means calculates changes of a temperature and the reaction rate expressed as functions of time, and a change of a viscosity expressed as a function of the reaction rate, for each time step and for each of said first three-dimensional solid elements, and further
   for each of first three-dimensional solid elements whose reaction rates reach a reaction rate of gelling, said flow analysis means calculates the strain component at the time of the heat curing, based on a relation between the reaction rate and a specific volume, and calculates the coefficient of elasticity at the time of the heat curing, based on relations of a reaction rate, temperature and a coefficient of elasticity.

3. The design support apparatus for a resin mold product, according to claim 1, wherein:
   said residual strain calculation means sets a representative point to each of said first three-dimensional solid element and each of said second three-dimensional solid element;
   for each of said second three-dimensional solid elements, said residual strain calculation means calculates averages of temperatures, coefficients of elasticity and strain components of at least one of said first three-dimensional solid elements whose representative points are close to a representative point of a second three-dimensional solid element in question, weighting said temperatures, said coefficients of elasticity and said strain components according to distances of said representative points from the representative point of said second three-dimensional solid element in question; and sets the calculated averages as a temperature, a coefficient of elasticity and a strain component to said second three-dimensional solid element in question.

4. The design support apparatus for a resin mold product, according to claim 1 wherein:
   for each of said second three-dimensional solid elements, said residual strain calculation means calculates residual strain, using the temperature, the coefficient of elasticity and the strain component set to a second three-dimensional solid element in question, and using a variation of coefficient of elasticity in a case where said temperature is cooled down to a predetermined temperature.

5. A computer-readable medium having a program readable by a computer, wherein:
   when said program is executed on said computer, said program implements the flow analysis means on said computer, which is used in the design support apparatus of claim 1 for a resin mold product.

6. A design support apparatus for a resin mold product made of thermosetting resin according to claim 1, wherein
   in the flow analysis means the reaction rate A(t) for a time period t is calculated from equations 1–5 as given below:

$$\partial A(t)/\partial t = (K_1(T) + K_2(T) A(t)^M)(1 - A(t))^N \qquad \text{Eq. 1}$$

$$K_1(T) = K_a \exp(-E_a/T) \qquad \text{Eq. 2}$$

$$K_2(T) = K_b \exp(-E_b/T) \qquad \text{Eq. 3}$$

$$A(t) = Q(t)/Q_0 \qquad \text{Eq. 4}$$

$$\partial Q(t)/\partial t = Q_0 (K_1(T) + K_2(T) A(t)^M)(1 - A(t))^N \qquad \text{Eq. 5}$$

wherein A refers to a reaction rate; t to time; T to temperature (molding condition, function of time t); $\partial A(t)/\partial t$ to a reaction rate; $K_1(T)$ and $K_2(T)$ to coefficients as functions of temperature; N, M, Ka, Kb, Ea and Eb to Intrinsic coefficients of the material; Q(t) to a heat release value until time t; $Q_0$ to a gross heat release value until the end of the reaction; and $\partial Q(t)/\partial t$ to a heat release rate;

and the viscosity η is calculated from equations 6–8 given below:

$$\eta = \eta_0(T)((1+A/A_{gel})/(1-A/A_{gel}))^{Q(T)} \quad \text{Eq. 6}$$

$$\eta_0 = a \exp(b/T) \quad \text{Eq. 7}$$

$$C = f/T - g \quad \text{Eq. 8}$$

where, η refers to a viscosity; $\eta_0$ to an initial viscosity; T to temperature; A to a reaction rate; $A_{gel}$ to a reaction rate at gelling; C to a temperature-rise coefficient; and a, b, f and g are intrinsic viscosity parameters of the materials; and the coefficient of elasticity E(T) is calculated from an equation given below:

$$E(T) = E_{gel}(T) + (E_0(T) - E_{gel}(T))(A - A_{gel})/(1 - A_{gel}) \quad \text{Eq. 14}$$

wherein, $E_{gel}$ (T) refers to the coefficient of elasticity at gelling at the temperature T; $E_0$ (T) to the coefficient of elasticity at the end of the reaction at the temperature T; and $A_{gel}$ to the reaction rate at gelling; and the linear curing strain component ε1 is calculated from an equation given below:

$$\epsilon 1 = \phi \Delta A \quad \text{Eq. 18}$$

wherein φ refers to a linear curing shrinkage coefficient; ΔA to (the reaction rate at curing—the reaction rate at gelling).

7. A method of supporting design of a resin mold product, where a computer is used to support design of a resin mold product made of thermosetting resin by implementing the operations of:

a flow analysis step in which a finite difference method or a finite element method is used to analyze a flow of thermosetting resin injected into a resin filling cavity to mold said resin mold product;

a residual strain calculation step for calculating thermosetting resin's residual strain after heat shrinkage of the thermosetting resin injected into the resin filling cavity to mold said resin mold product; and a strength analysis step in which a finite element method is used to analyze strength of said resin mold product; wherein:

in said flow analysis step;

a reaction rate model is indicated by using a reaction rate A;

wherein A is an index of reaction progress extent whose initial value at the reaction is 0, and the change rate of A ($\partial A/\partial t$) in the initial period is relatively high in comparison to a rate during times after the initial period, and the reaction rate A is saturated toward 1 with lapse of time;

and wherein viscosity η, coefficient of elasticity E, and linear curing strain component ε1 are calculated by replacing the changes of each component with the change of the reaction rate A;

in said flow analysis step, a temperature, a coefficient of elasticity and a strain component of the thermosetting resin at a time of heat curing are calculated for each of first three-dimensional solid elements used for flow analysis;

in said residual strain calculation step, correspondence between each of second three-dimensional solid elements used for strength analysis in said strength analysis step and each of said first three-dimensional solid elements, and the temperature, the coefficient of elasticity and the strain component calculated for each of said first three-dimensional solid elements in said flow analysis step are used in order to set a temperature, a coefficient of elasticity and a strain component at the time of heat curing for each of the second three-dimensional solid elements, and residual strain after the heat shrinkage is calculated for each of said second three-dimensional solid elements; and in said strength analysis step, the residual strain after the heat shrinkage, which is calculated in said residual strain calculation step, is set to said each of said second three-dimensional solid elements, and the strength of said resin mold product is analyzed.

* * * * *